United States Patent [19]
Schroeder

[11] Patent Number: 5,955,743
[45] Date of Patent: Sep. 21, 1999

[54] SUPERCONDUCTIVE TUNNEL ELEMENTS, TUNNEL STACKS PRODUCED THEREFROM AND USE THEREOF

[76] Inventor: Hehrwart Schroeder, Dreilindenstrasse 10, Ueberlingen-Hoedingen, Germany, 88662

[21] Appl. No.: 08/894,912
[22] PCT Filed: Feb. 24, 1996
[86] PCT No.: PCT/DE96/00310
  § 371 Date: Sep. 2, 1997
  § 102(e) Date: Sep. 2, 1997
[87] PCT Pub. No.: WO96/27214
  PCT Pub. Date: Sep. 6, 1996

[30] Foreign Application Priority Data
  Mar. 1, 1995 [DE] Germany .................. 195 07 024

[51] Int. Cl.[6] .................................. H01L 29/06
[52] U.S. Cl. .................. 257/30; 257/31; 257/36; 505/702

[58] Field of Search .................. 257/28, 30, 31, 257/32, 33, 34, 35, 36, 37, 38, 39; 505/702

[56] References Cited

U.S. PATENT DOCUMENTS 5,121,173 6/1992 Wilson ........................... 357/5
5,347,143 9/1994 Schröder ........................ 505/191

FOREIGN PATENT DOCUMENTS 0 446 927 9/1991 European Pat. Off. .
0 513 557 11/1992 European Pat. Off. .

*Primary Examiner*—Sara Crane
*Attorney, Agent, or Firm*—Evenson, McKeown, Edwards & Lenahan, P.L.L.C.

[57] ABSTRACT

The invention relates to a superconductive tunnel element comprising superconductors, barriers and insulators, which tunnel element has the following layer structure: superconductor (S1), insulator (I), superconductor (S2), barrier (B), superconductor (S3), insulator (I) and superconductor (S4).

16 Claims, 17 Drawing Sheets

SUPERCONDUCTIVE TUNNEL ELEMENTS, TUNNEL STACKS PRODUCED THEREFROM AND USE THEREOF

BACKGROUND AND SUMMARY OF THE INVENTION

The invention relates to superconductive tunnel elements, tunnel stacks produced therefrom and use thereof.

EP 0 513 557 A2 discloses superconductive tunnel elements, tunnel stacks produced therefrom and uses based thereon. These tunnel elements have the structure superconductor, tunnel barrier, superconductor; there is in each instance an insulated superconductive control layer within the two superconductors. This arrangement gives a uniform and homogeneous flux of the current-induced magnetic fields of the control layers through the superconductors, so that the energy gap of the superconductors can be controlled very accurately. Moreover, the symmetrical structure of this element permits a nonproblematic integration of a plurality of elements to form a tunnel stack, in that superconductors and barriers are alternately disposed successively one on another. However, a disadvantage of this device is that a large number of individual layers are present. Thus, one superconductor already consists of five individual layers (one control layer, two insulating layers for insulating the control layer and two superconductive layers). Accordingly, the production of these tunnel cells is very costly and expensive.

The object of the invention is accordingly to specify a tunnel element which can be produced substantially more simply and cheaply with hardly any impairment of controllability as compared with EP 0 513 557 A2.

This object is achieved by a tunnel including superconductors, barriers and insulators. The tunnel element has the following layer structure: superconductor (S1), insulator (I), superconductor (S2), barrier (B), superconductor (S3), insulator (I), and superconductor (S4). Advantageously designed tunnel elements are provided. Advantageous possible circuits of the tunnel elements are specified. Advantegous tunnel stacks produced from the novel tunnel elements are also specified. Uses of the tunnel elements are also provided.

In the text which follows, the invention is explained in greater detail with reference to illustrative embodiments of tunnel elements, their circuits and of tunnel stacks and their uses.

DETAILED DESCRIPTION OF THE DRAWINGS

Figure 1:
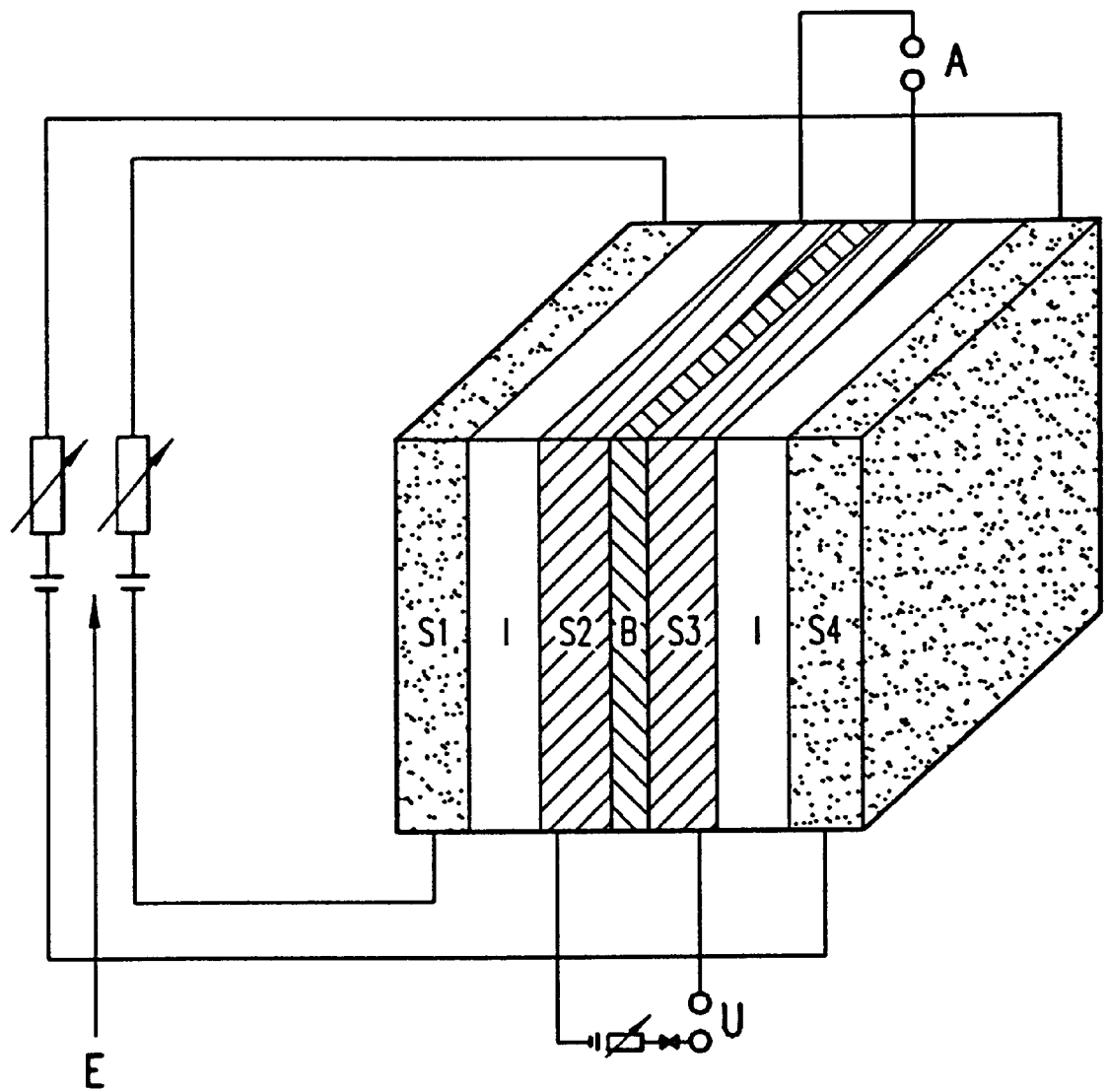
FIG. 1 shows a tunnel element with circuit diagram.

The tunnel element shown in FIG. 1 has the following symmetrical layer structure. On a layer-type barrier B there are disposed on both sides layer-type superconductors S2 and S3, on the free surfaces of which layer-type insulators I and, thereon, layer-type superconductors S1 and S4 are disposed. Each superconductor S1 to S4 has individual superconductive connections. The superconductors S2 and S3 are superconductive tunnel layers and are connected to a regulable signal current source A as well as to a control of the working voltage U, and a tunnel diode or a transistor is connected in the circuit of the latter.

The superconductors S1 and S4 serve as superconductive control layers for the energy gap control E. The current-induced fields permeate in each instance uniformly through the entire volume of the superconductive layers S2 and S3. The layer structure shown here is the densest possible packing which can still fulfill the principle of individual control by the two superconductive control layers. By reason of the small number of individual layers, production involves relatively low cost; this is effective, in particular, in a stack comprising a large number of individual tunnel elements.

The concept of barriers or tunnel barriers is to be understood in the present application to the effect that such layers are to permit tunnelling. In contrast, the concept of insulators is to be understood to the effect that tunnelling is in each case to be prevented by these layers. It is known to the person skilled in the art that this difference can be achieved in particular by an appropriate choice of the layer thicknesses. Typically, insulators have a thickness exceeding or equal to 5 nm. Barriers preferably have a thickness of less than 5 nm in particular 1 to 1.5 nm.

Figure 2:
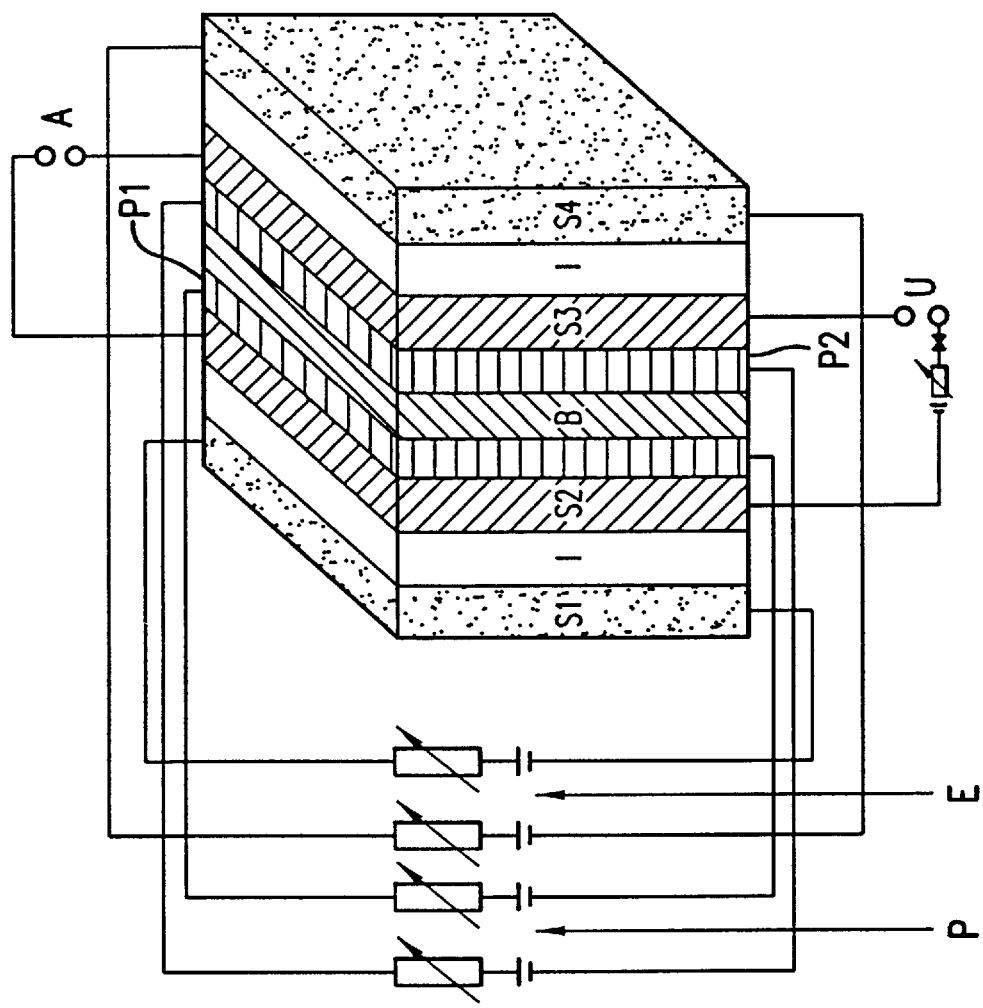
FIG. 2 shows a variant of a tunnel element with circuit diagram.

A so-called proximity tunnel element is produced, according to the invention, from the tunnel element according to FIG. 1. This is shown in FIG. 2. In this case, there is provided between the central barrier B and the adjacent superconductors S2 and S3 respectively, which serve as tunnel layer, in each instance a normally conductive or semiconducting layer or a superconductive layer P1, P2 with an energy gap which is smaller than the energy gaps of the tunnel layers S2, S3. Apart from the control P of the proximity layers P1, P2, the circuit of such a tunnel element remains unchanged and is designed in the manner shown in FIG. 1. The proximity effects extend from the superconductive layers into the adjoining normal conductor and conversely with a range which corresponds to the coherence length. The result is that the normal conductor becomes superconductive and in the case of the superconductor the critical temperature falls. The proximity tunnel effect is generated by the interposed layer between barrier and superconductor. Typically, these intermediate layers have thicknesses of up to 2 nm. In a proximity tunnel circuit, the tunnel state density alters markedly. The proximity tunnel cell makes it possible to extend the superconductive electronic applications by means of mesoscopic quantum phenomena. Particular areas of application are the detection of X-rays and γ-rays, for example by photon-assisted tunnel processes.

Figure 3:
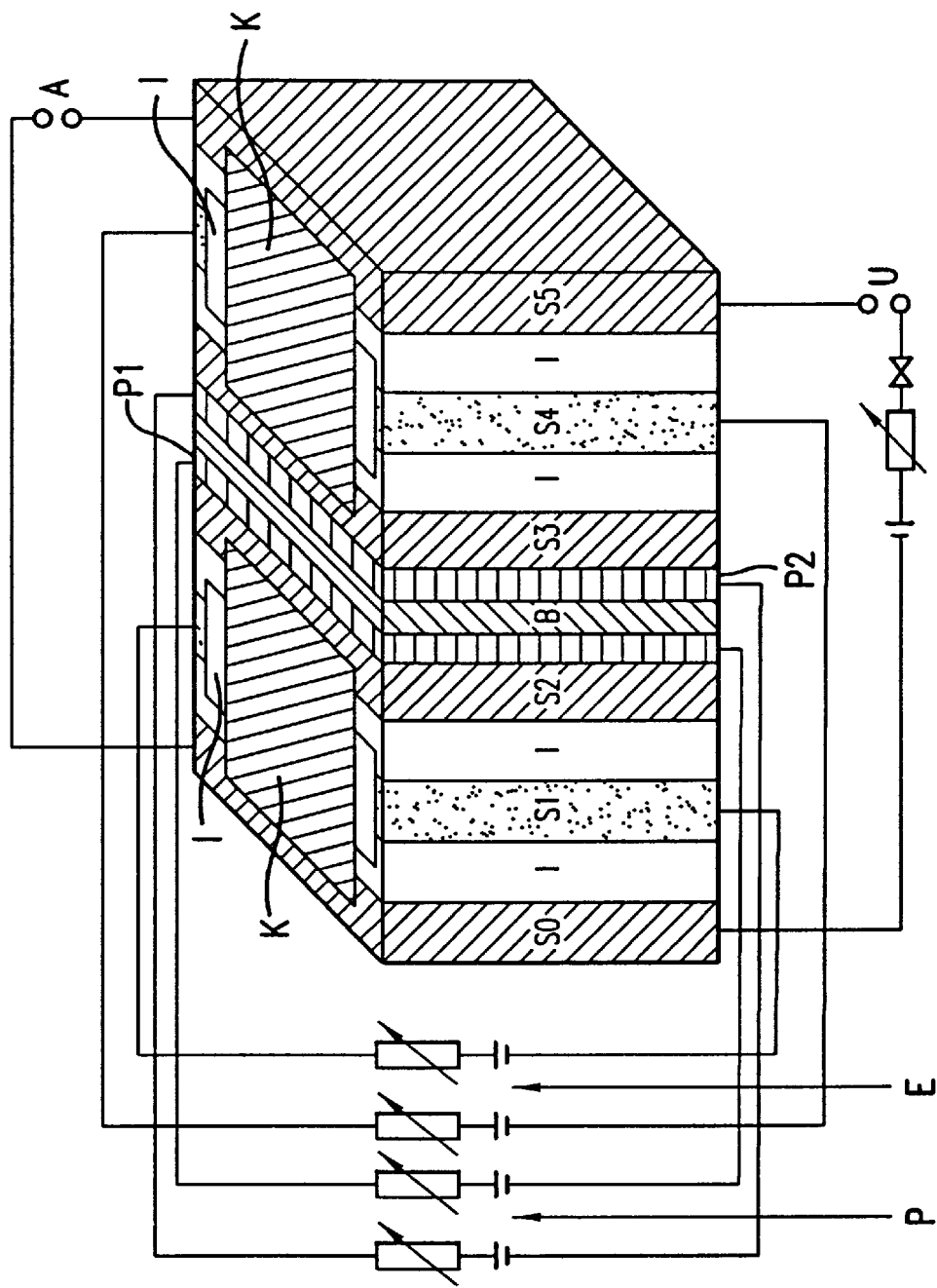
FIG. 3 shows a further variant of a tunnel element with circuit diagram.

Proximity effects can also be used in that embodiment of a tunnel stack which is shown in FIG. 3. Between the central barrier B and the adjacent superconductors S2 and S3 respectively, which serve as tunnel layer, there is provided in each instance a normally conductive or semiconducting layer or a superconductive layer P1, P2 having a small energy gap. In other respects, this tunnel element has the same basic structure as the tunnel element shown in FIG. 1; however, in each instance on the outer superconductors S1 and S4 respectively there are additionally provided layers in the form of an insulator I and of a further superconductor S0 and S5 respectively. In the case of this tunnel element, the superconductors S1, S4 serving as control layers are disposed between two superconductors S0, S2 or S3, S5 serving as tunnel layers, whereby a particularly symmetrical structure and homogeneous fields are achieved. The current-induced fields permeate through the superconductive layers S0, S2 or S3, S5 from the center; this is particularly advantageous as regards the complete control capability of the tunnel element. In this case also, all superconductors S0 to S6 are provided with individual superconductive connections. This gives rise to a large number of possible meaningful combinations of electronic circuits; in this case, relevant aspects are not only combinatorial circuits with superconductive layers, but also the magnitudes of direct and alternating voltages and frequencies of alternating voltages. Since the control takes place centrally, a particularly homogeneous field can be built up.

Preferably, the superconductors S0, S2 and S2, 5S respectively serving as tunnel layers are connected on both sides of the barrier B via a short circuit bridge K which is preferably likewise designed to be superconductive. Each short circuit bridge K is separated by a layer-type insulator I from the respective superconductor S1 or S4 serving as control layer. The circuit of this element corresponds to that shown in FIG. 1 and FIG. 2, and therefore will not be explained further.

Figure 4:
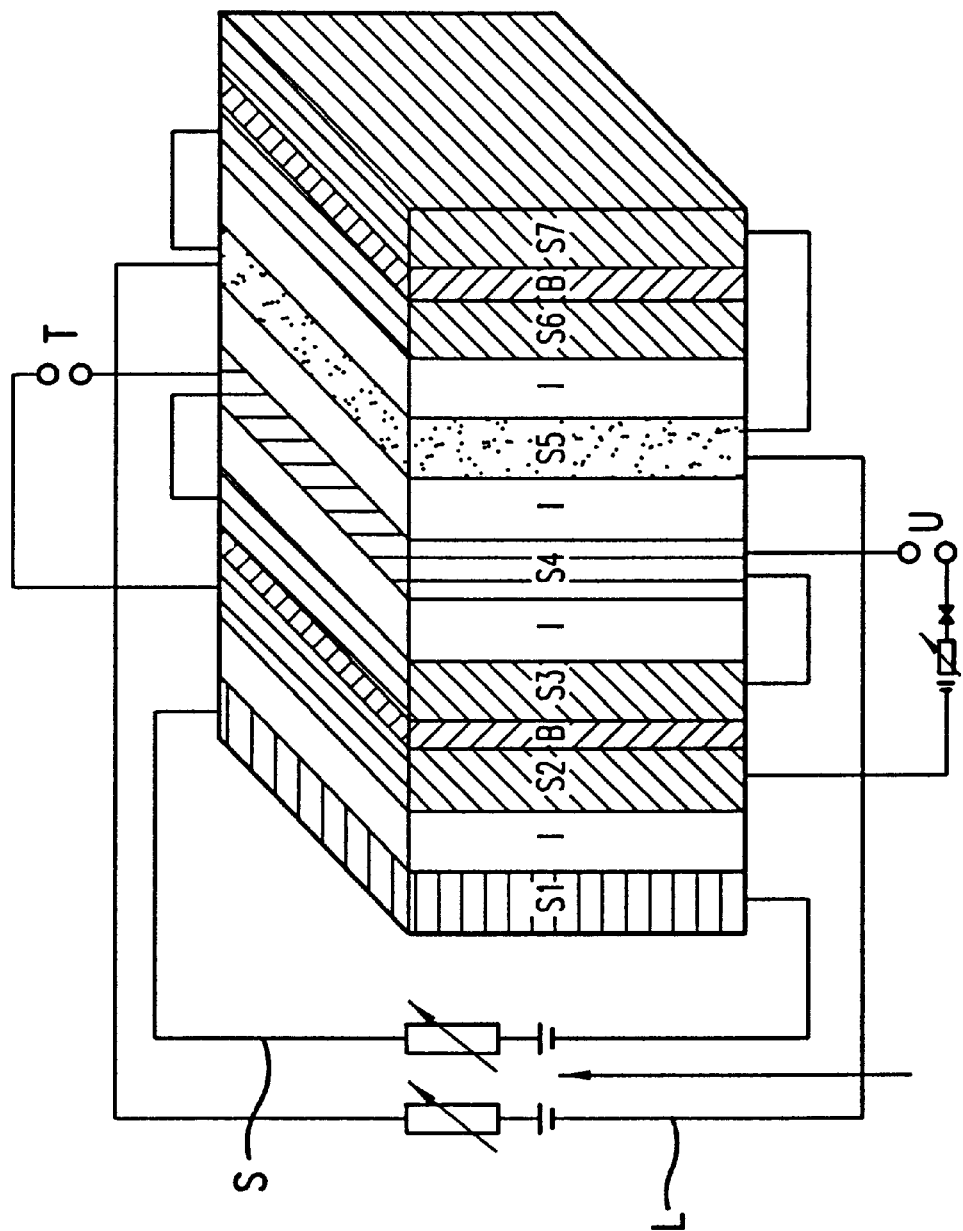
FIG. 4 shows a further variant of a tunnel element for computer circuits, with circuit diagram.

FIG. 4 shows a tunnel element to implement the memory principle of Juri Matisoo for computer circuits (Juri Matisoo, Josephson Computer Technology, LT15, pages 1590 to 1597, (1978)). This tunnel element proceeds from a basic structure as described in FIG. 1, i.e. superconductors S1 and S2, and S3 and S4 respectively, separated by insulators I, are provided on both sides of a barrier B. What is novel is that on one side there adjoin additional layers: an insulator I, a superconductor S5, a further insulator I, a further superconductor S6, an additional barrier B and a further superconductor S7. With this design of the tunnel element, the superconductors S2 and S3 are the tunnel layers, the superconductor S1 becomes the write line, the superconductor S4 becomes part of a tunnel loop, and the superconductor S5 serves as read line; in this case, the read line S5 forms a circuit together with the Josephson contact comprising superconductor S6, additional barrier B and superconductor S7. All together represent the memory cell for "binary 0" or "binary 1" respectively. FIG. 4 shows a circuit in which T designates the tunnel current, S the write line, L the read line and U the working voltage control; in this case, a tunnel diode and a transistor are connected in the circuit of the working voltage control.

In the "write" function, the write line lies over the tunnel loop as control line. The read line lies under the tunnel loop as control line. If currents are simultaneously passed through the write line, the tunnel contact of the tunnel loop passes over into the normally conductive condition and displaces the loop current into the other branch of the loop. If both currents are switched off, the contact again becomes superconductive, and the magnetic field induces a "binary 1". To write the element content "binary 0", the write line must remain free from current. The loop current then flows away through both branches of the loop and ceases to have effect. Accordingly, no permanent current is created.

In the "read" function, currents are passed simultaneously through the tunnel loop and through the read line. If the element contains a permanent current, the additional loop current flows through the branch of the loop which controls the tunnel contact of the read line. The contact of the read line becomes normally conductive and a signal appears at its output. If the tunnel loop contains "binary 0", the loop current is symmetrically divided among both branches. Thus, the contact in the read line remains superconductive and no signal appears at its output.

Each one of the described tunnel elements can be combined into a tunnel stack; in this case, insulators or barriers for the circuit separation of the individual tunnel elements are disposed in each instance between two adjacent tunnel elements.

Figure 5:
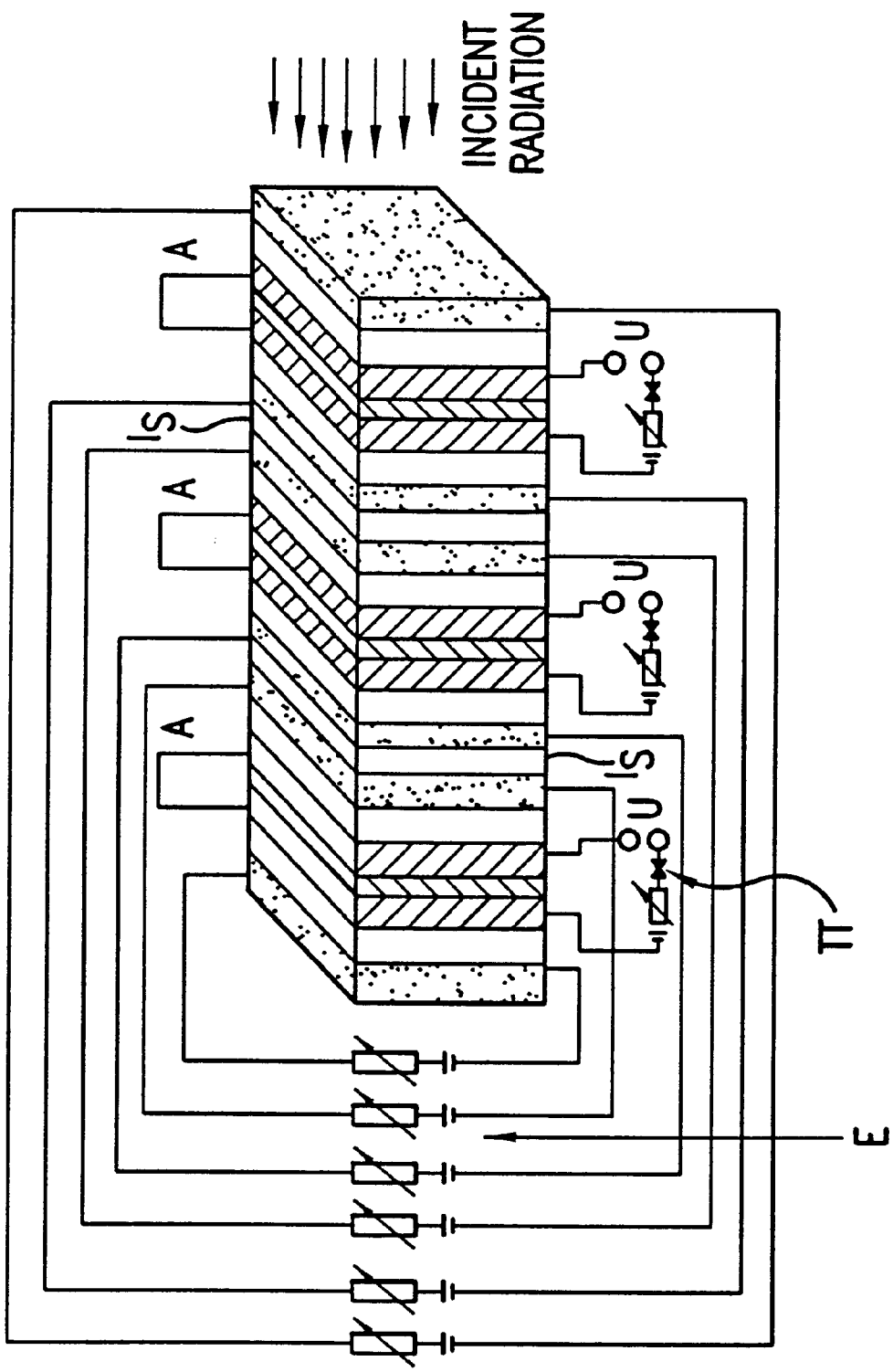
FIGS. 5 to 8 show in each instance a tunnel stack composed of individual tunnel elements, with circuit diagram.

FIG. 5 shows a tunnel stack comprising three individual tunnel elements according to FIG. 1. Insulators $I_s$ are disposed between the tunnel cells, in order to suppress parasitic tunnel processes between superconductive control layers and superconductive tunnel layers. The tunnel barriers within an individual tunnel cell are designated by $B_t$. The remaining designations of the individual layers correspond to those used in FIG. 1. The control of the intensity can take place on the nonlinear part of the characteristic by control of the tunnel current in stepless fashion and by deenergizing the individual superconductive tunnel cells. The energy gaps of the individual layers can be controlled in unitary fashion and individually from zero to maximum.

Figure 6:
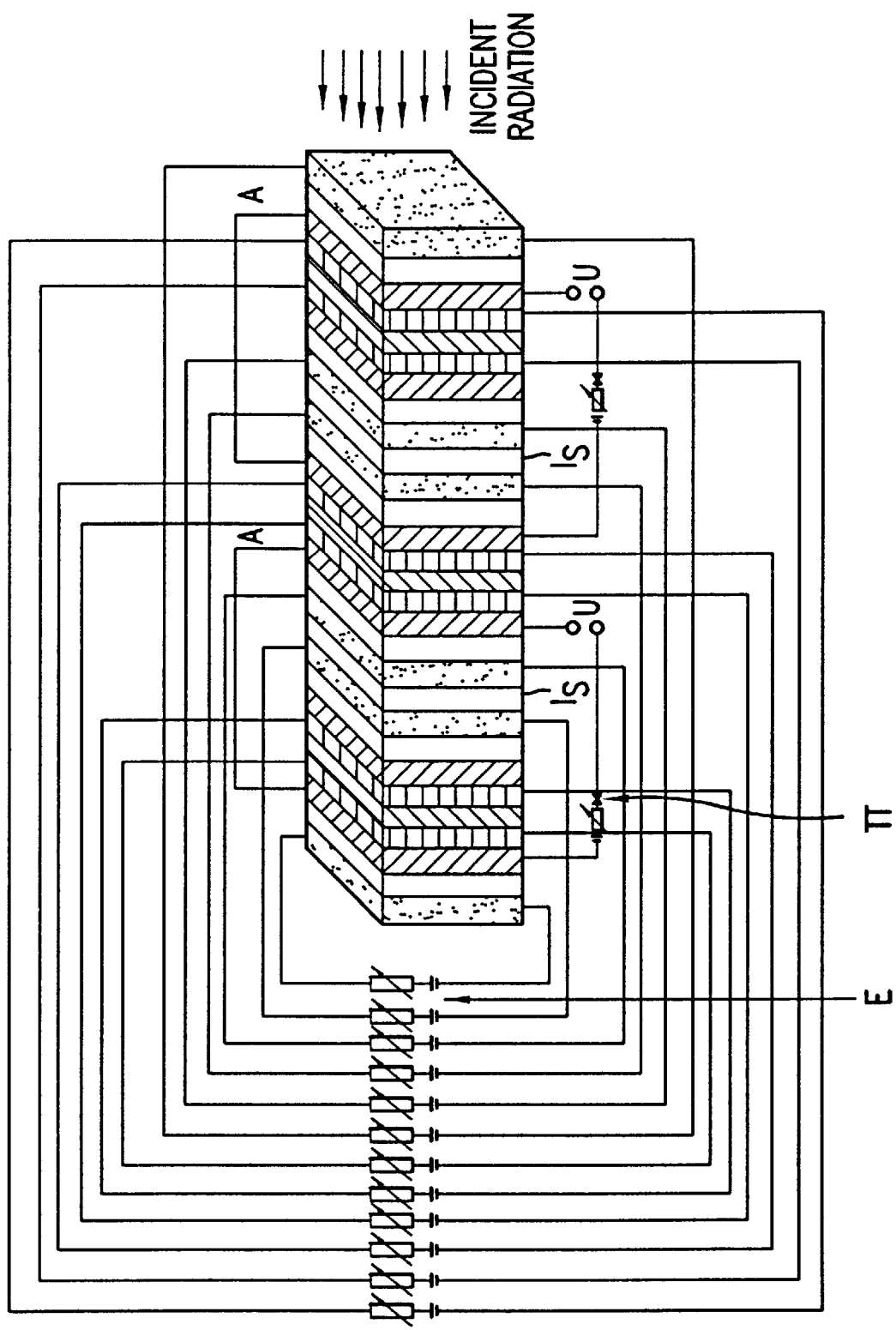

The reference symbols specified in FIGS. 5 to 8 have the following meaning:
A signal current
E energy gap control
TT tunnel diode or transistor
U working voltage control
K superconductive short circuit bridge
I insulating layers for the short circuit bridges
T tunnel current
L read line
S write line FIG. 6 shows a tunnel stack composed of three individual tunnel elements according to FIG. 2. Insulators $I_s$ are disposed between the tunnel cells.

Figure 7:
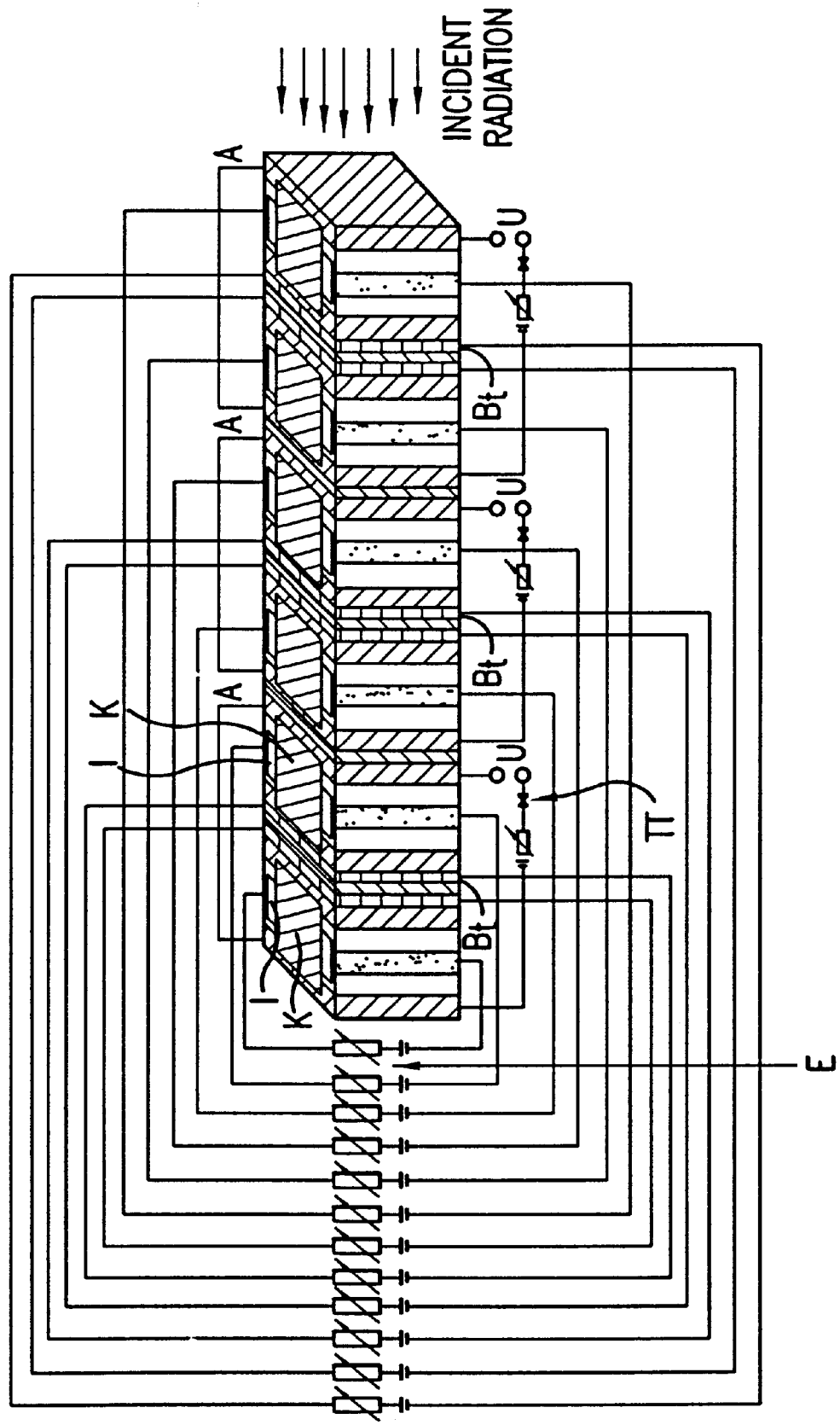

FIG. 7 shows a tunnel stack composed of three individual tunnel elements according to FIG. 3. Tunnel barriers $B_t$ are disposed between the tunnel elements.

In a further embodiment not shown here, insulators may also be disposed in place of tunnel barriers.

In the case of the proximity stacks according to FIGS. 6 and 7, there are also further interesting properties. These are principally various boundary surface effects. In addition, use is made of interactions of effects of various excitation mechanisms, so-called mesoscopic phenomena on the nm scale with boundary surface effects and tunnel processes, technically for various detection mechanisms. One possible application is a camera for X-rays and γ-rays.

Figure 8:
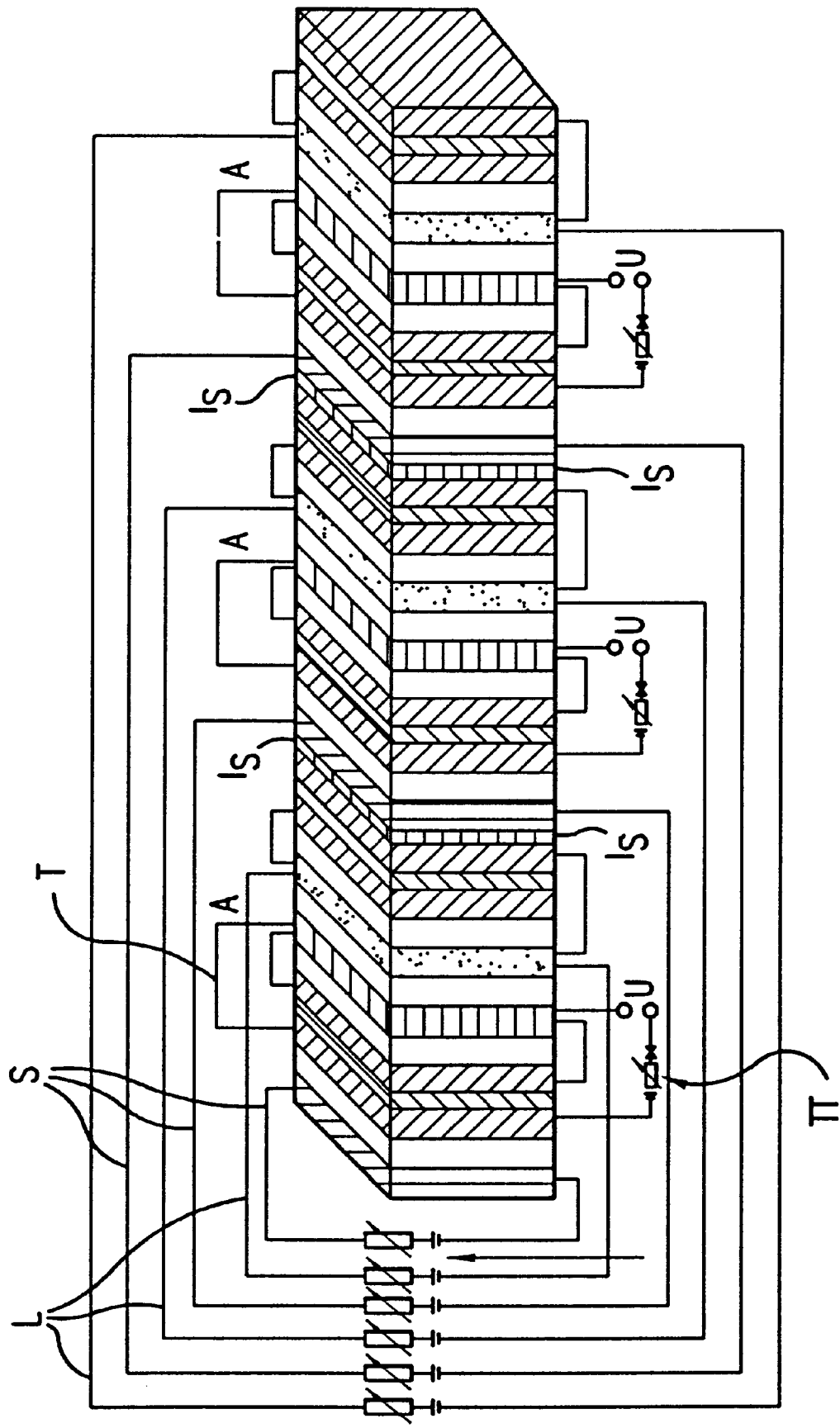

FIG. 8 shows a tunnel stack composed of three individual tunnel elements according to FIG. 4. Insulators $I_s$ are disposed between the tunnel elements. With such tunnel stacks, data storage is possible with a high storage density. Typically, such a stack comprises approximately 40,000 tunnel elements, the result being a stack height of approximately 2 centimeters. With a diameter of a stack (with insulation) of approximately 1 µm, there are approximately $25.10^{12}$ tunnel elements on a tunnel stack field (see FIG. 9) having an edge length of 2.5 cm. One tunnel element stores one bit, so that the memory has an available storage capacity of approximately 3 terabytes.

As all superconductors are provided with individual, preferably superconductive connections, any selectable meaningful combination of electronic circuits is possible; in this case, with the use of program controls, the best mathematically determined circuit structure can be implemented in problem-oriented fashion. The very flexible tunnel stack circuit which is the result of this thus becomes a superior instrument of superconductive electronics. In principle, tunnel stacks have properties entirely different from those of the individual tunnel cells. By way of example, the radiation intensity of the tunnel stack increases quadratically with each further tunnel cell in the stack. The self-synchronization which becomes effective in the tunnel stack system has the practical result that the line width of the tunnel radiation becomes progressively narrower as the number of tunnel cells increases.

The disadvantage of the low signal strength in all superconductive circuits is compensated by an ideal series circuit of tunnel elements in the stack. If, for example, the working voltage satisfies the condition for the detection mode, i.e. is smaller than 2 DELTA and all layers are controlled with the same energy gaps, the detection power less the noise power is totalled with each layer. In the case of a detector, the signal/noise ratio for the useful signal improves in proportion to the number of pairs of layers. With a number n of tunnel elements, in the detection mode n different frequencies are detected simultaneously if each n-th tunnel element has differing energy gaps. The n different frequencies can be individually set. The sensor current increases in proportion to the number of incident photons. The efficiency is very close to unity.

If the working voltage satisfies the condition for the transmission mode, i.e. is greater than 2 DELTA, and all tunnel elements are controlled with the same energy gap, the radiation intensity is totalled with each additional tunnel element. With a number n of tunnel elements, n different frequencies are transmitted simultaneously in the transmission mode if all tunnel elements have differing energy gaps. By reason of the very low output power of a Josephson element, it is recommended to combine as many tunnel elements as possible for the desired frequencies.

Since each tunnel element can be controlled individually, there is not only the option "all tunnel elements with equal energy gaps" or the option "all tunnel elements with differing energy gaps" but also the option "any selectable combinations". Thus, by way of example, it is possible to combine any selectable number of tunnel elements for any selectable desired frequencies in order to concentrate the detection power or the transmission intensity.

Superconductive tunnel elements operate as a parametric amplifier at a defined working voltage. By reason of the individual controllability of each individual tunnel element, the possibility is created of for example coupling with the detector mode the capability of superconductive tunnel elements of amplifying signals parametrically. In this case, one or more tunnel elements which are disposed on the side remote from the radiation are employed for amplification.

Each individual tunnel element is also suitable as a switch, since it has the required control lines as integrated control layers. By means of the magnetic fields generated within the superconductive control layers, the tunnel contact can be switched to be normally conductive or superconductive. For use in superconduction-based computers, the two required independent control lines on the tunnel element are also present.

A tunnel stack is produced in the form of a heteroepitactic superlattice. To this end, in the first instance the material of the substrate baseplate is selected in such a way that it is compatible with the materials to be employed, with respect to the lattice constants. It is possible selectively, as an option, to prepare a mirror of suitable superconductors on the substrate baseplate. Layers of sufficient thickness of superconductors are very much more efficient than conventional mirrors as mirrors for a spectral range of particular interest. The superconductive mirror can improve the performance levels of the stack. The actual tunnel stack can then be prepared on this base described above. This consists of a defined layer sequence of superconductive layers and barriers (thin insulators) or insulators (thick insulators).

The two superconductive tunnel layers are separated by thin barriers, in order to permit the tunnelling process. The control layers adjacent to the superconductive tunnel layers are insulated by an insulator layer, in order to suppress disturbing tunnel phenomena.

The superconductive layers should be as thin as is permitted by the functional capability of superconduction. By way of example, the material of the high temperature superconductors is still superconductive by reason of the particularly small coherence length in the order of magnitude of nm. The insulators at the flanks of the control superconductors must suppress tunnelling and are therefore preferably about 5 nm thick. They must be selected so that their permeability to the radiation is as great as possible. The most stringent requirements are imposed on the barrier. They must all be absolutely impervious and should have a thickness of 1 to 1.5 nm. The layer sequence facing radiation should satisfy the condition of an optically thin layer, i.e. the superconductive layers must be very much smaller than the wavelength of the radiation with which it is intended to operate. The superconductive layers must attain at least the thickness of the coherence length specific to the material. This means that the entire stack has a thickness in the order of magnitude of µm. As the layers are very thin, the entire stack is also only a thin foil.

The smaller the surface area of a tunnel contact, the better it is protected against faults. For the sensor system objectives which are aimed at, the tunnel surface must be at least as large as the radius of the first diffraction ring of the so-called Airy disk of the working wavelength. Since it is possible to construct, in terms of circuitry, almost any desired larger surface from numerous smaller surfaces by interconnection, it is possible to adapt to any longer wavelength with effect from the energy-gap-dependent minimum wavelength, which it is not possible to undershoot. If an individual tunnel element were to be prepared with a thickness of 60 nm, a tunnel stack of for example 10,000 tunnel elements would be approximately 0.6 mm thick.

The connections for the working voltage and for the signal current are located on the superconductive tunnel layers. The superconductive control layers which in each superconductive tunnel layer are disposed to be insulated from the environment are connected to their own current loop. This is repeated for all tunnel elements of a tunnel stack. Further, two mutually opposite flanks of a stack should preferably remain free of switching contacts. On this basis, the intention is to guarantee that, besides a coupling-in by means of optically thin layers, coupling-in via the flank directly into the barrier also remains open.

For a tunnel element to operate, a bias voltage must be applied to the superconductive tunnel layers situated on both sides of the barrier. The magnitude of this bias voltage decides the mode: detection, parametric amplification or transmission. The working bias voltage must be coupled to the variably controlled energy gap, and it must be controlled accurately with a degree of accuracy in the order of magnitude of nanovolts.

A stepless control of the intensity is performed by control of the tunnel current. Instead of using superconductive components for the control, a transistor circuit connected in series with a precision voltage source may for example carry out this task. Within the linear region of the characteristic, a linear resistor can control the working voltage. In the nonlinear region of the characteristic, the working voltage alters only slightly, but the tunnel current rises steeply. By reason of the nonlinear characteristic fields of the transistor, it is possible in this way to construct a suitable control element for the stepless control of the tunnel current.

The magnitude of the energy gap within the excitation spectrum of a superconductor is dependent upon the temperature, the magnitude of the electromagnetic field which is present and the magnitude of the current flowing through. The control may take place by means of fields or by means of temperatures.

The energy gaps in superconductive layers can be altered and thus controlled by the action of electromagnetic fields. The magnetic fields are generated in integrated superconductive control layers. In this case, the current-induced control field must be homogeneous and must permeate through the superconductive layer uniformly. This is also a reason why the superconductive layers should be as thin as possible.

The superconductive control layers can also be controlled via the temperature. This can take place in two different ways. One possibility consists in inductively heating the superconductive tunnel layers by means of high frequency alternating voltages on the control layers. The second possibility consists in using the control layers as heating system after exceeding the critical current in the control layers. The tunnel layers are then heated via the thermal contact. By reason of the very thin superconductive layers, the very poor thermal conduction of the superconductors can be disregarded. In the case of an energy gap control via temperature changes, the unbound electrons make contributions to the temperature increase over very high frequencies and thus lead to a reduction of the critical current. The energy gap control via the temperature gives rise to an expectation of sharper frequency settings than the control via the magnetic field, while on the other hand more time is expected to be used up.

Each alteration of the energy gap alters the condition appertaining to the working voltage, so that the control of the working voltage should be coupled to the current values of the energy gap.

The detection function means that the electrical waves pass through the optically thin layers without attenuation; in this case, they interact with Cooper pairs. These interactions lead to forced oscillations and then break up the Cooper pairs if the relation hf=DELTA is satisfied. The alternating current created is strictly proportional to the frequency of the electric waves.

In the case of the "transmission" function, where the working voltage is greater than 2 DELTA, the same energy or more energy is supplied to the Cooper pairs, as compared with the energy corresponding to the binding energy of the Cooper pairs. The binding energy of the Cooper pairs corresponds to the energy gap DELTA in the excitation spectrum of the superconductor. Microwave radiation and lattice oscillations (hypersound) are created. The frequency of the created electric waves and the frequency of the lattice oscillations are strictly proportional to the magnitude of the energy gap. The magnitude of the bias voltage decides: a broad-band or frequency-selective detection, parametric amplification or transmission, the magnitude of the bias voltage being coupled to the magnitude of the current energy gap.

If a tunnel stack is to detect or transmit, or if a number of tunnel elements are to undertake parametric amplification, the working voltage must have precise values. If specified wavelengths are chosen, the energy gap must have specified precise values. The working wavelength or, following conversion, the working frequency is attained by the thereto equivalent energy gap in the excitation spectrum of the superconductor. The energy gap in the superconductive tunnel layers is—as stated above—controlled via magnetic fields or temperatures of the superconductive control layer. The control parameters are dependent upon other parameters such as for example the energy gap and must be coupled thereto. By reason of the large number of tunnel elements in a tunnel stack and by reason of the extremely flexible possible combinations with differing setting and application functions with control structures with or without feedback mechanisms, whether automatic or semiautomatic, it is advisable to make use of an intelligent program control. Preferably, process computers are used; in this case, a particularly good level of performance is attained in circumstances in which all switching and computing operations are based on superconductive circuits. The use of neuronal networks improves the performance level.

Figure 9:
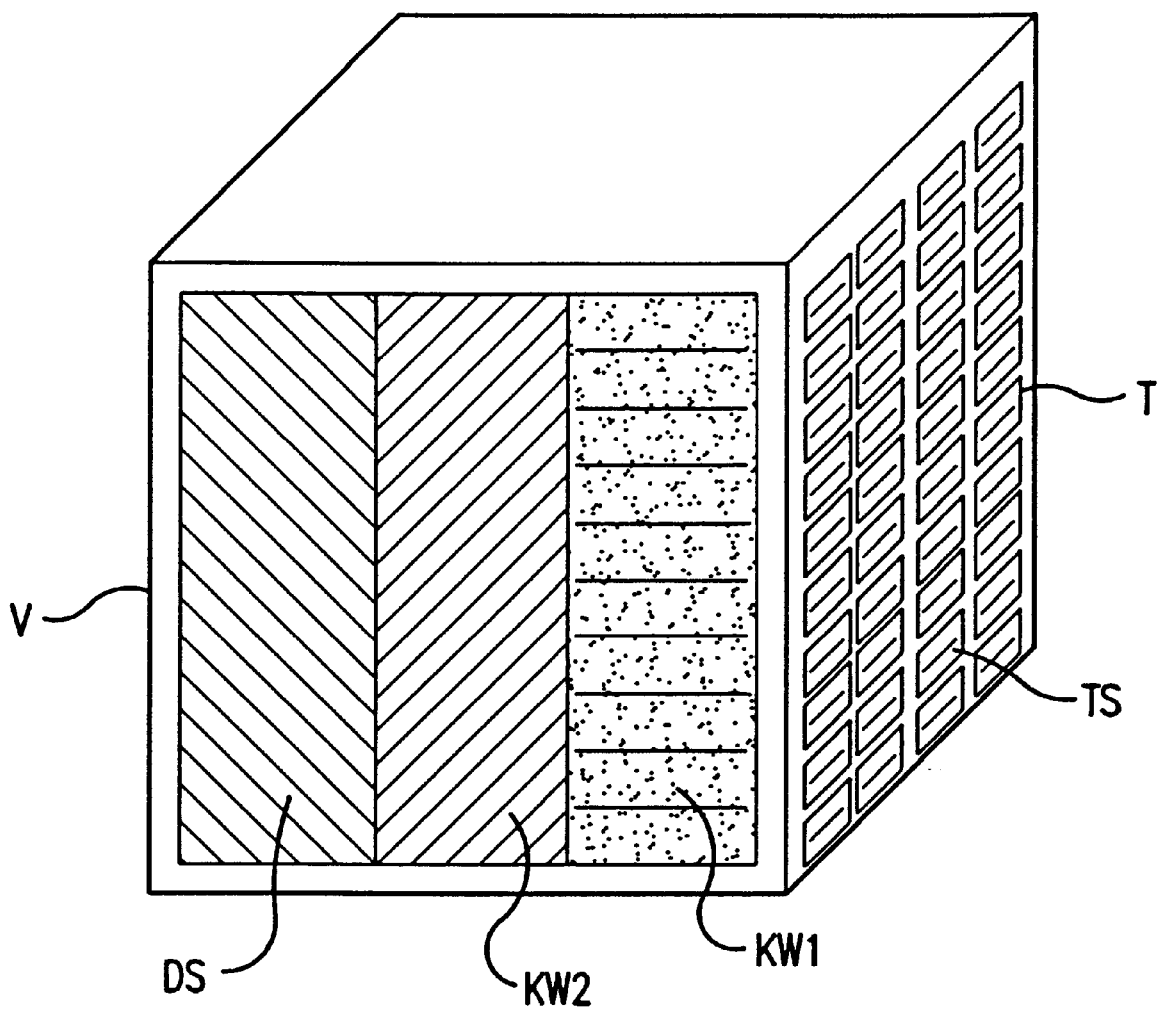
FIG. 9 shows a tunnel stack field on a substrate parallelepiped.

For various applications, it is necessary to combine a number of tunnel stacks TS into a tunnel stack field F. FIG. 9 shows a tunnel stack field F on a substrate parallelepiped, in which for example 25,000 lines with in each instance 25,000 tunnel stacks TS are disposed on a surface of 2.5×2.5 cm. In the substrate parallelepiped, there are disposed behind the tunnel stacks TS digital contact selector circuits KW 1 for each tunnel stack TS, which serve for the control of all tunnel cells in the stack individually or in any selectable combinations. Adjoining the same, there is provided a digital contact selector circuit KW 2 for all tunnel stacks TS which are in turn connected to data and control lines DS to form electronic plug-in connections on the rear wall of the parallelepiped, as are known from plug-in cards of conventional installations.

The surface shape for the arrangement of the tunnel field can be selectable at will. A circular or square surface is preferred. In general, a tunnel stack field is put together from similar tunnel elements or tunnel stacks. For special applications, it is, however, also possible to combine differing designs of tunnel elements and/or tunnel stacks in one field.

Just like the individual tunnel stack, the tunnel stack field is also situated on a contact plate, which on the rear surface offers space for the control and evaluation logic. This can take place using modular construction, as in the case of conventional electronics cards. This offers the advantage of achieving high switching speeds, for example in the order of magnitude of picoseconds, and short signal transit times for 1 cm of approximately $10^{-11}$ seconds; this is the particular advantage of superconductive electronics.

Figure 10:
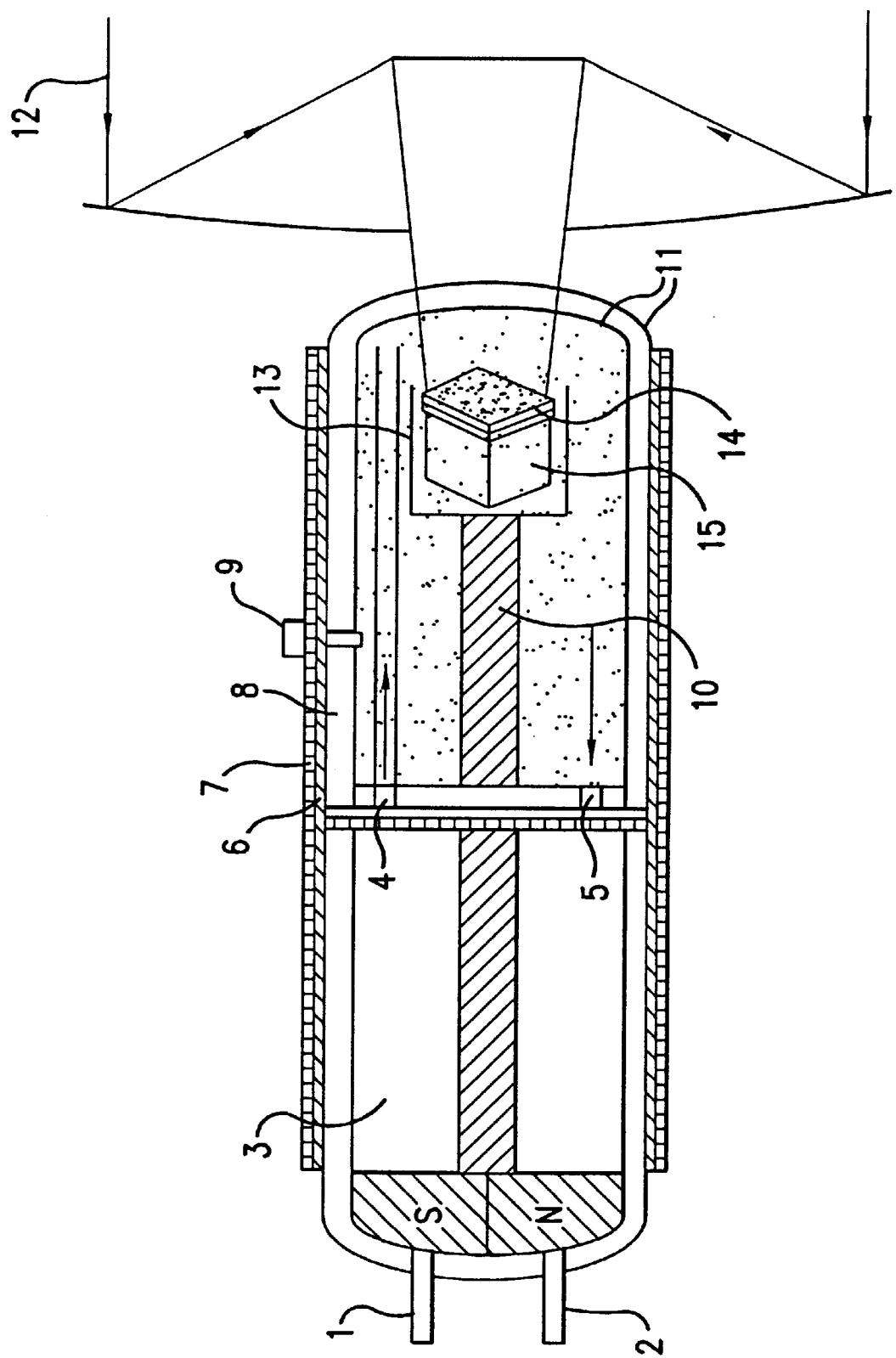
FIG. 10 shows a digital superconductive electronic camera in the pivotable Dewar with a Cassegrain mirror system in diagrammatic representation.

A preferred application of the invention is given by a digital superconductive electronic camera. FIG. 10 shows the diagram of a digital superconductive electronic camera in the pivotable Dewar with a Cassegrain mirror system.

The general structure of a cryostat is known and is not described here. The reference symbols specified in FIG. 10 have the following meanings:
1 superconductive plug connection
2 normally conductive plug connection
3 miniaturized liquefaction system in accordance with the Joule-Thomson principle
4 inlet for liquid nitrogen
5 outlet line for liquid nitrogen
6 superinsulation
7 impact attenuation made of plastic material
8 vacuum
9 safety valve
10 mounting with control and signal line
11 dome
12 Cassegrain parabolic mirror
13 superconduction-based screening
14 tunnel stack field
15 superconduction-based evaluation electronics.

The actual digital superconductive electronic camera consists of the following assemblies: one or more substrate parallelepipeds with in each case one tunnel stack field, an electronic control system to operate the tunnel stack, a superconductive screen against disturbing fields and control and signal lines.

Each individual tunnel stack can be perceived as a multispectral transmission and reception system. If, based on a target resolution, sufficiently many tunnel stacks are disposed in lines in a field or on a surface, the created individual signal points can be combined into an image, whereby the region of space within the angle of view of the camera can be imaged by the tunnel stack field. Since each tunnel stack can see without limitation in a frequency-selective manner as from a minimum wavelength in the direction of longer wavelengths, the camera acquires penetrative properties by reason of the frequency dependence of the absorption. The camera enables the following functions: the production of infrared and microwave images on the basis of any desired wavelength, precision surveys of objects in space by transit time measurements and a formulated coordinate system and the recording of spectra of chemical compounds which enable comparison with data in spectrum libraries. Thus, the camera can be used quite particularly for the location, surveying and identification of objects.

In FIG. 10, the camera is provided with a Cassegrain parabolic mirror, at the focus of which the tunnel stack field is located. Of course, the camera can also be used without mirrors. Another possible application consists in using it in a pivotable Dewar with liquid helium instead of with liquid nitrogen; in this case, an additional radiation screen with liquid nitrogen (not shown) is provided. The camera has a further spectral range available, which begins in the short wavelength region at a few microns and can then extend virtually to infinity in the long wavelength region. As a result of this, it is possible continuously to prepare images on the basis of any selectable frequency of objects. The frequency-selective extension to longer wavelengths leads to the capability of the camera also to see into the interior of the objects. It is possible to achieve precision measurements of IR and microwave spectra with high resolution, which permit chemical analysis in comparison with stored spectra of a data file. With the aid of Doppler measurements, radical velocities can be measured. Furthermore, transmission can take place using any selectable frequency or any selectable group of frequencies, and the transit time to receipt of the echo can be measured; this permits spatial detections. As a result of the measurement of the Planck radiation curve and determination of its maximum, the temperature at a target location can be computed. The precision measurement of infrared and microwave spectra is particularly important, for the reason that all the information on molecular structure is contained in the infrared or microwave spectra. Accordingly, by means of a total analysis, the pertinent molecular structure can be assigned to each spectrum observed. As different compounds never have identical infrared spectra, these are like fingerprints and thus a reliable aid in qualitative analysis for the identification of unknown chemical compounds, which takes place by comparison of the spectrum of the unknown compound with known spectra. It is possible, by controlled pulsed radiation, e.g. by suitable microwaves from special superconductive tunnel stacks, to excite a number of chemical compounds which then imitate their own rotation spectrum, by means of which the compounds can be identified. The temporally declining emission signals are sampled at intervals of a few nanoseconds and processed by computer.

In the case of nonpolar compounds such as for example the gases hydrogen, oxygen and nitrogen, which cannot be detected using rotation spectra, use can be made of Raman spectra which are formed by unelastic scattering of photons at the molecules. On the basis of the Raman spectra, it is possible to make statements concerning the frequencies of the self-oscillations, the moments of inertia and the shape of the molecules. In the course of the frequency-selective vision using the camera, as the working wavelength increases the camera penetrates progressively further into the objects and makes use of this information for example for an image-generating process. If all suitable wavelengths are utilized, separately from one another, for the purpose of obtaining information, it is also possible to gain information from the interior of the objects. One application also resides for example in surgery in that, in wounds, it is possible to distinguish between contaminations and living substance.

In the application of the camera for the reading and understanding of molecular spectra, very low radiation power levels are present. By reason of the sensitivity of superconductive tunnel circuits which is beyond any competition, it is possible to detect very weak signals; in this case, as a result of the high switching speed the switching times which total up do nevertheless permit high resolutions, so that molecular spectra with very fine structures can be recognized, and in this connection mixed spectra can also be better identified.

To read the spectra, the camera traverses the entire spectral range at a selectable recording speed. The recording speed is predetermined by times which the physical processes traverse. The coordinate scales are predetermined by fine structures which can and must be measured. The spectral scale for the abscissa could for example consist of a wavelength subdivision which detects the finest structures. For the ordinate, the maximum intensity would have to be detected and nevertheless a fine resolution of the intensity could be achieved.

As images are put together from many individual pixels, the tunnel stacks are ordered in lines into a field, so that from the one tunnel stack which gives information as a pixel, the individual pixels are now combined into an image consisting of many pixels. As a result of the possibilities of the individual switching of each tunnel stack, the camera is able to execute analytical procedures extending as far as the surveying and identification of objects.

The transmission energy of an individual tunnel cell is very low and is in the order of magnitude of nanowatts to microwatts. Via the summation principle in the tunnel stack and via a special design of the tunnel elements, the transmission energy can be increased by many orders of magnitude.

The packing density of the tunnel stacks per surface must be formulated so that the number of tunnel stacks and thus the number of pixels lead to a maximum resolution. As a result of the flexibility of the circuit, it is possible not only to achieve a pixel through a single tunnel element, but it is also possible to merge a plurality of tunnel elements in order to formulate a pixel. Depending upon what is desired, this merging can create a variable sensor surface for a new pixel.

If the wavelength employed becomes large in comparison with the sensor surface, for working in the long wavelength spectral range it is possible to combine a plurality of spatially separate sensor surfaces, in order to improve the resolution using the methods of interferometry. The distances between the combined tunnel stack surfaces must be much greater than the wavelengths employed. This means that, if it is desired to detect persons buried under 20 m of rubble, using a detector, sensor equipment having a surface area of a few meters is necessary.

Figure 11:
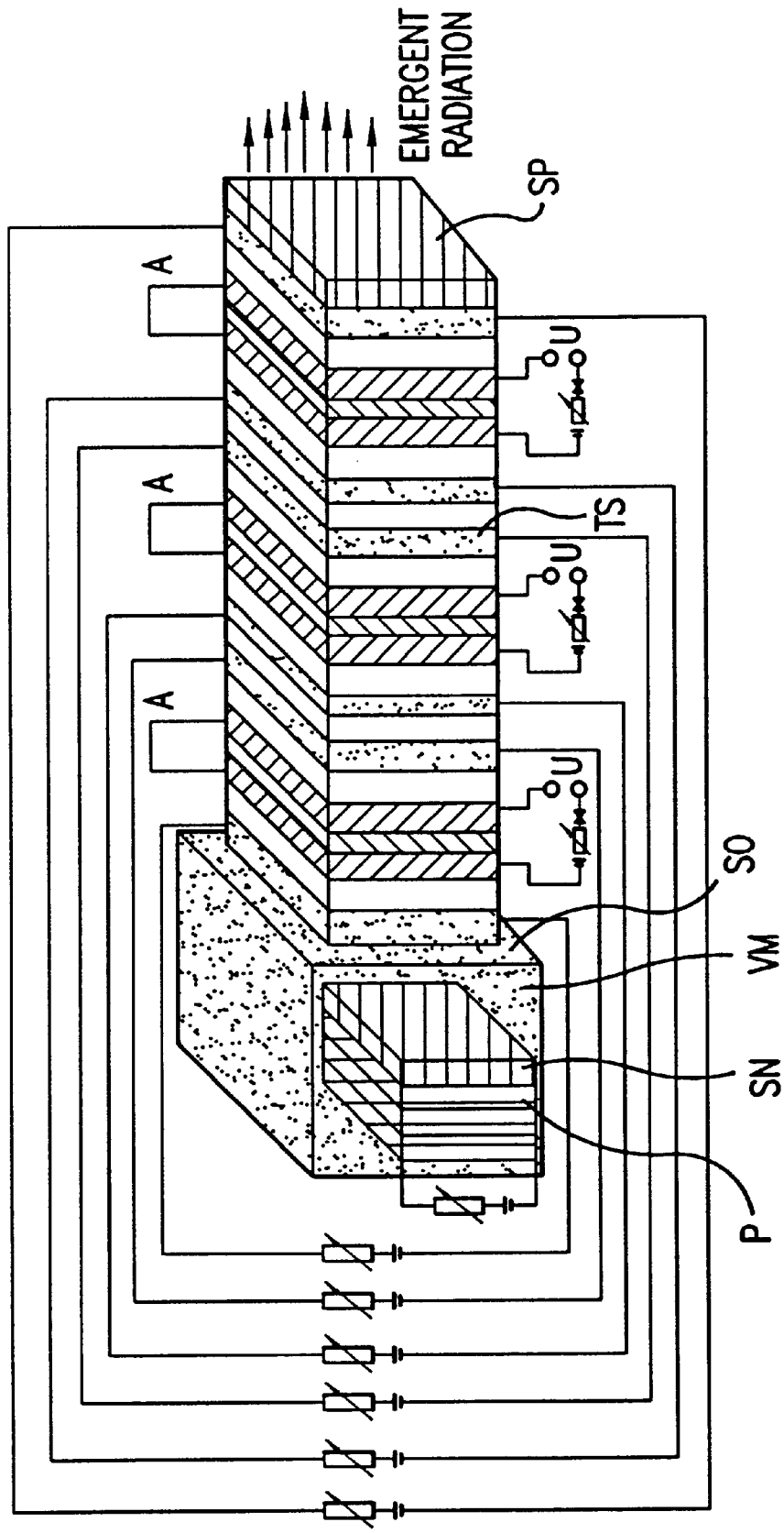
FIG. 11 shows a superconductive electronic coherent radiator with normal mirrors.

A further application of the invention consists in superconductive electronic coherent radiators. FIG. 11 shows a superconductive electronic coherent radiator with normal mirrors. The tunnel stack TS comprises a plurality of tunnel elements of the type shown in FIG. 1. Alternatively, it can also be constructed from tunnel elements according to FIG. 2 or according to FIG. 3 (the latter with or without proximity layers P1, P2). P designates a piezo-stack which is disposed with series circuit in the substrate, SN designates the movable mirror situated on the piezo-stack P, VM designates the vacuum, SO designates the substrate surface and SP designates a mirror which transmits from outside and from inside is semi-transmitting, that is to say reflecting.

Figure 12:
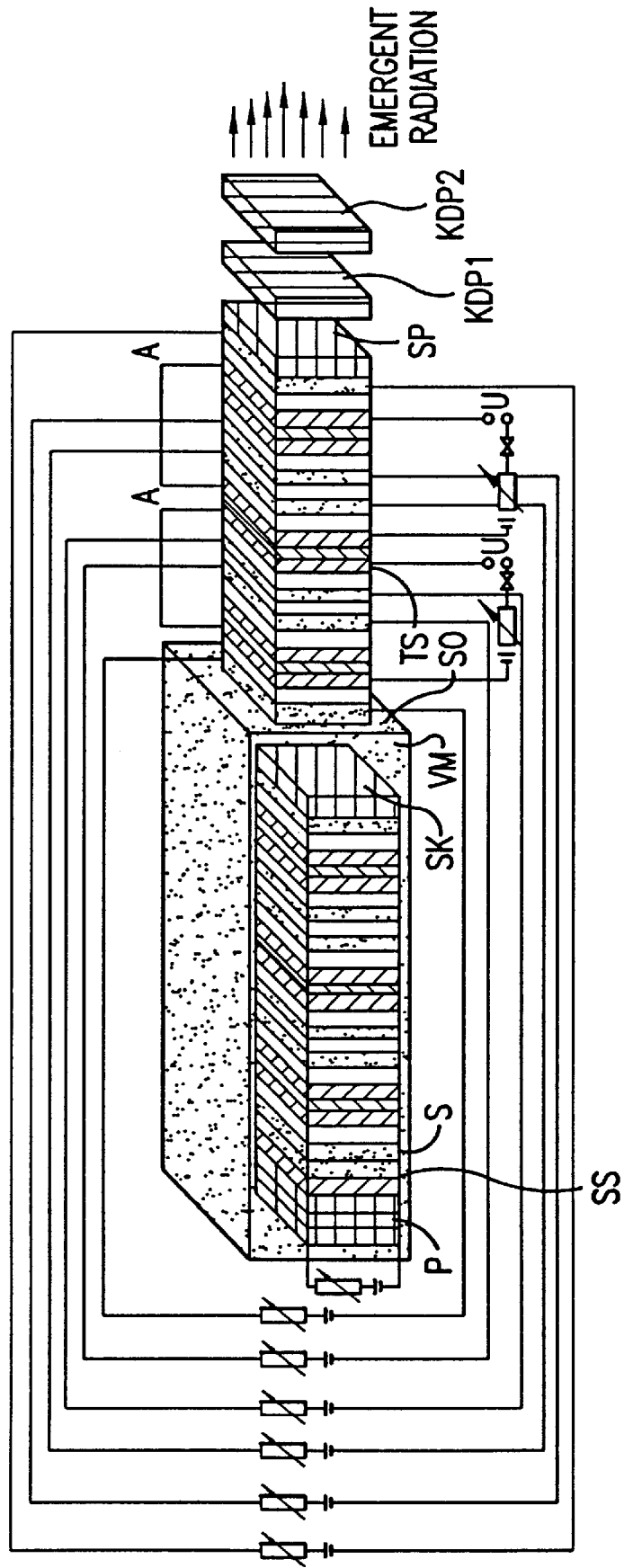
FIG. 12 shows a superconductive electronic coherent radiator with phase-conjugate mirrors and with frequency multiplication.

FIG. 12 shows a superconductive electronic coherent radiator with phase-conjugate mirrors and with frequency multiplication. The components included in the radiator according to FIG. 11 have the same reference symbols. There are additionally provided a superconductive screen SS, a substrate S and a phase-conjugate mirror SK; in this case, between the piezo-stack P [lacuna] there are disposed a superconductive screen SS, a substrate S and two tunnel stacks TS composed of individual tunnel elements according to FIG. 1. However, the tunnel stacks TS can also be constructed from tunnel elements according to FIG. 2 or according to FIG. 3 (the latter with or without proximity layers P1, P2). Ahead of the mirror SP which transmits from outside and is semi-transmitting from inside there are further disposed, for frequency multiplication, two crystals of potassium dihydrogenphosphate KDP 1 and KDP 2. Of course, if frequency multiplication is not desired, the radiator according to FIG. 12 can be designed as a superconductive electronic coherent radiator with phase-conjugate mirrors without the crystals of potassium dihydrogenphosphate KDP 1 and KDP 2.

With respect to the circuit, reference is made to the diagrams according to FIGS. 11 and 12. All radiators have in common a specific substrate parallelepiped, micropiezo positioning systems, specific tunnel stacks, a resonator system, a mounting with control and signal lines, as well as special electronic control arrangements for operating the micropiezo positioning systems and tunnel stacks.

The tunnel elements in the stack are optimized and designed for high tunnel currents and high intensities. The intensity resulting from the number of tunnel elements in the tunnel stack is designed to be at least of such magnitude that the nonlinear phase-conjugate mirrors can operate and that influence can be exerted on the chemistry of the target compounds via the supply of accurately metered radiation energy of the required frequency or a group of frequencies. In the case of applications of the radiator for modulation functions in the metabolism, monochromatic and coherent radiations are required; in this connection, a microwave beam is defined as monochromatic radiation if its partial waves all have the same wavelength or the same frequency. The radiation must be monochromatic in order to be able to influence a chemical process with a wavelength or frequency which is selected on an application-oriented basis. A microwave beam is coherent if its partial waves all have constant differences in their phase constants; in this connection, fixed phase relationships must exist between the partial waves, since otherwise the waves cannot interfere with one another. The radiation must be coherent if holographic applications are desired.

A tunnel stack optimized for maximum transmission intensity is incorporated in a microwave resonator; in this case, the resonator principle of laser technology is taken over. The resonator stores the energy which assumes a maximum for the resonance or intrinsic frequencies.

If the frequency of the working wave is equal to the resonant frequency, a standing wave is formed between the mirrors and the radiation density in the resonator adopts a maximum. Accordingly, the resonator must be tunable to all frequencies by means of a variable resonator length. In the substrate parallelepiped, the respective mirror system is disposed on the piezo-stack, in the case of a phase-conjugate mirror in the form of a nonlinear crystal. Preferably, use is made of a four-wave mixing principle. Using phase conjugation, it is inter alia possible to correct phase disturbances and aberrations of optical systems. At the other end of the stack, on the side facing the radiation, mirrors made of superconductive material are preferred, in order to be able to utilize the particular advantages of superconduction for reflections.

The physical properties of the tunnel stacks permit the generation of a radiation of any selectable frequencies. The fixed phase relationship of the superconduction pertains to the coherent property and the resonator system pertains, through interference, to the monochromatic property of the radiation. In the case of that version of the radiator which is shown in FIG. 12, the radiation properties of the radiator are extended to the ultraviolet region, using the method of frequency multiplication of nonlinear crystals. With the aid of the two KDP crystals, triple the frequency of the output frequency of the tunnel stack is generated in a two-stage process. This can be carried out up to the wavelength of approximately 0.250 micron. In the case of higher frequencies, the crystal is no longer transparent. The radiation generated is monochromatic and coherent.

Phase-conjugate mirrors can be produced in accordance with two processes. On the one hand, by four-wave mixing and on the other hand by induced scattering. Phase-conjugate mirrors are nonlinear optical mirrors which reflect the radiation only from a specified power density onwards. In the case of the phase-conjugate mirror, the reflected wave converges and propagates opposite or "time-reversed" as compared with the incident wave. This means that the wave does not obey the reflection law of plane mirrors, but travels back into itself. Phase disturbances in optical systems can be compensated with the aid of phase conjugators in that the optical system is traversed twice in opposite directions. At a phase-conjugating mirror, the wavefronts of the incident and the reflected wave are identical, but the direction of propagation is opposite at each position of the wavefront. The microwave radiation created in a tunnel stack is reflected back by a phase conjugator into the stack. The occurring interference of the resonator system leads to the monochromatic wave which is desired, which is then coupled out from the beam path. The phase conjugation leads to a doubling of the effective amplifier length with simultaneous elimination of phase disturbances in the tunnel stack. An additional result is a reduced sensitivity to possible dejustments of the mirrors. Phase conjugators permit lensless images.

The length of a resonator system for tunnel stacks must be flexible, by reason of the altering working wavelengths of the tunnel stack system, and must not be obstructed. It is therefore necessary to provide an automatic length adaptation of the resonator system to the respective requirements, and piezo technology is suitable for this. FIG. 11 shows a tunnel stack which is situated on a selected substrate, in the resonator. All plug connections are prefabricated in this substrate parallelepiped. The substrate parallelepiped may have dimensions having a side length of several cm and a thickness of several mm to several cm. For the resonator version of the tunnel stack system, it is appropriate to incorporate the movable mirror which is disposed at the end of a piezo-system—preferably a piezo-stack system—along with the entire piezo positioning system in the substrate parallelepiped. The piezo micropositioning system must have its own voltage supply, and it must have accuracy for precision positionings of the orders of magnitude of fractions of an atomic position. The length of the piezo-stack alters with the voltage, up to a maximum value of the expansion specific to the material. The changes in length take place in microseconds and faster. For one mm, a voltage of approximately 200 V is necessary. By reason of the high voltage, which may be several thousand volts, if the piezo elements are to stretch or be compressed by a few mm, the superconductive screening becomes necessary. The piezo-stack is encapsulated with superconductive material for this purpose.

If a phase conjugation on the basis of a four-wave mixing is intended, this requires a second microwave source. This is accomplished by a second tunnel stack with identical specification on the side opposite to the signal. The sequence is then: piezo-stack—tunnel stack for generating a reference wave—nonlinear crystal—tunnel stack for generating the signal wave and for reading out the phase-conjugate wave—unilaterally acting semitransmitting mirror. A specific tunnel stack which can be specifically optimized for the practical application is situated on the surface of the substrate parallelepiped of the actual substrate surface. The tunnel stack has the dimension of a foil. On its surface and in the radiation direction there is situated the second resonator mirror. The advantages of superconductive mirrors can be used for the second mirror. It must act unilaterally in semitransmitting reflective function, and indeed only inwards back into the tunnel stack.

As regards a resonator system for the field arrangement of numerous tunnel stacks on a small surface, three solution routes are appropriate.

1. A movable mirror for all tunnel stacks in the substrate and a fixedly disposed or movable second mirror for all tunnel stacks at the opposite end of the tunnel stacks (separate fixing), the tunnel stacks are free in the resonator system.
2. The second mirror is individually disposed at the end of each tunnel stack and
3. for each tunnel stack there is provided its own micropositioning system, preferably as the final layer on the tunnel stack.

In the case of the solution according to 1., it is possible to operate all tunnel stacks with one movable mirror; in this case, the immovable or movable second mirror could likewise be a relatively large mirror which would again be responsible for all tunnel stacks and would possibly have to be incorporated separately. Even though this second mirror would be prepared for each stack individually at the end of the stack, in the case of this version all tunnel stacks must in each instance operate with the same wavelength.

According to solution 3, which permits the greatest possible physical flexibility of a tunnel stack resonator field to be achieved, each tunnel stack must be given its own micropositioning system, which then permits the entire system to compile any selectable combination of coherent monochromatic beams. The individual tunnel stack may operate only with in each instance one wavelength. The combination, selected with the aid of many tunnel stacks, involving various wavelengths can then individually be transmitted simultaneously by each tunnel stack.

A piezo-element or a piezo-stack has dimensions in the order of magnitude of millimeters in length and microns in diameter. Accordingly, the piezo-stack system is far longer than a tunnel stack, the diameter and the length of which are of the order of microns. As the length of the piezo-stack increases, the dimension in length also increases. The diameter of the piezo-stack and of the mirror must be approximately concordant with the diameter of the respective tunnel stack.

The entire piezo-mirror system is incorporated in a substrate parallelepiped; in this case, sufficient empty space between stack and substrate surface must be provided for the movement of the mirrors. The substrate surface must be selected with respect to its material and designed in its geometry in such a way that it transmits radiation, preferably in the infrared and millimeter spectrum. The stabilizing insulating material in the space between the piezo-stacks must not obstruct the operation of the stacks. The piezo-elements must be able to stretch and contract without obstruction. This could take place for example using substrate material which would then likewise have to be co-created plane for plane.

On the external surface of the substrate surface there is then situated the tunnel stack or the tunnel stack field with in each instance the second mirror is to be transmitting as coupling-out mirror for the radiation coming from outside; this takes place in accordance with the principle of unilaterally transmitting windows.

The novel coherent radiator has radiation properties like laser systems, but it extends over the entire spectral range. By reason of its free selection of the wavelength or of the frequency as compared with the laser system, the radiators may for example be used for medical, biological and chemical applications. The field of application also includes holography and holographic interferometry; in this connection, holographic interferometry is understood as referring to the images of objects which are traversed by those interference fringes which correspond to lines of constant spacing between two conditions of the objects. Holographic interferometry serves for analysis of oscillations, for the testing of materials and for the investigation of the change in form of workpieces which are subjected for example to temperature and/or pressure changes. An individual radiator may be a component of other systems. Where chemical changes are performed by precise energy input and precise resonance conditions, it would be desirable to modulate this complex chemical process in synchronous fashion using an arbitrarily selectable sum of individually different radiation energies and resonance conditions; this is possible as a result of a tunnel stack resonator field, which may likewise be a component of other systems.

Figure 13:
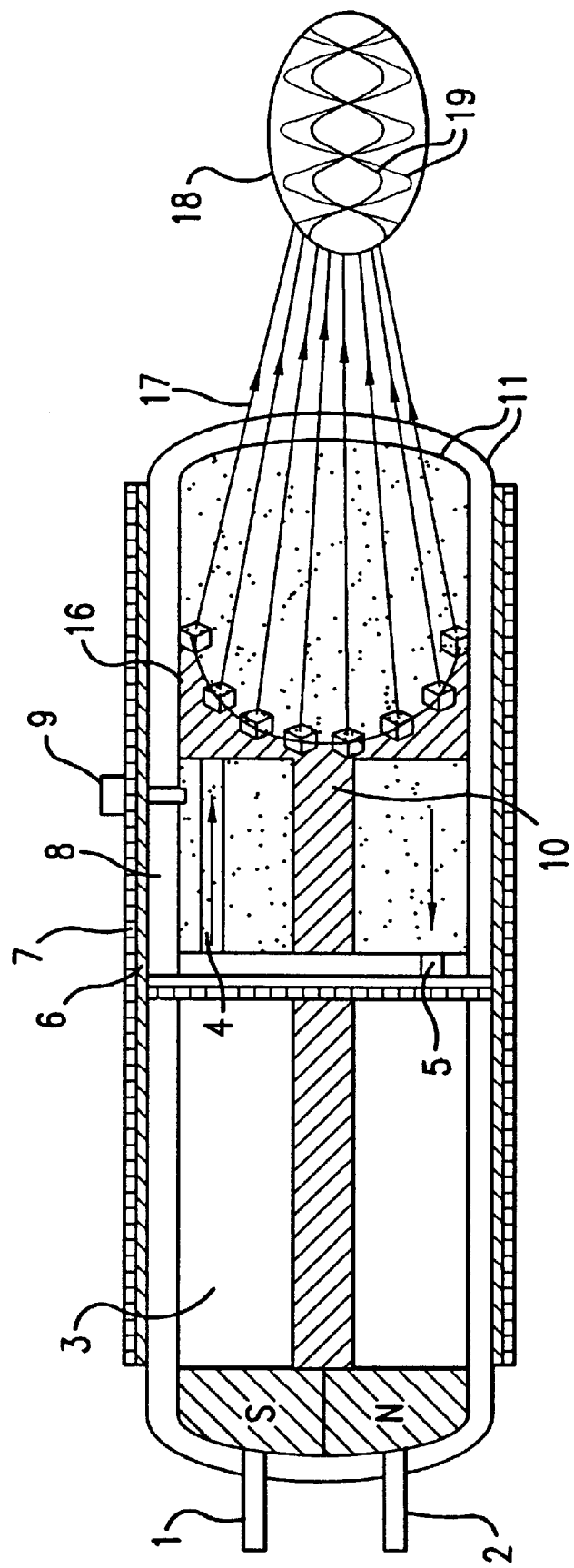
FIG. 13 shows a superconductive electronic radiation pincer in diagrammatic representation.

FIG. 13 shows the diagram of a device for micropositioning within living cells, also referred to in the text which follows as a superconductive electronic radiation pincer. The reference symbols 1 to 11 have the meaning explained in the case of FIG. 10. Further, the radiation pincer has coherent superconductive electronic radiators 16 which can be pivoted individually and the beams 17 of which induce standing waves 19 in a cell 18. The standing waves 19 position cell organelles in the interior of a living cell, its minima and maxima being fixed in space.

Thus, the superconductive electronic radiation pincer consists essentially of a superconductive electronic radiator for monochromatic and coherent waves. The high flexibility which is possible as a result of the tunnel stack guarantees that it can operate precisely at all wavelengths. On this basis, analytical and diagnostic aids of the superconductive transmission and reception system can also assist microoperations in a closed cell by constant feedback with current measurement results. Standing waves which are individually adjustable and which are combined into a group as a radiation pincer serve, as already mentioned, by way of example for the positioning of cell organelles. A superconductive electronic radiation pincer consists of the following assemblies: a plurality of substrate parallelepipeds in a spherical arrangement with a field of superconductor electronic coherent radiators, precision adjusting devices for the radiators, electronic control to operate the tunnel stacks, electronic control to operate the piezo-stacks, superconductive screens against disturbing fields and mountings with supply lines (control and signal lines; see also the circuit diagrams in FIGS. 11 and 12).

A plurality of sets of components which are positioned at various angles form a viable radiation pincer, with which micropositionings can then be undertaken from a plurality of sides and from various angles. The control of the radiation pincer must bring about standing waves in the cell to be processed, maintain those waves and control them in the sense of the positioning operations.

The invention can also be used for quantum interference devices (SQUID). SQUID is the abbreviation for superconductive quantum interference devices. The function of SQUIDS is based on the Josephson effect. Josephson elements interrupt a superconductive ring in which a supercurrent is induced.

A superconductive loop which is interrupted by a tunnel contact is referred to as an RF-SQUID. A superconductive loop which is symmetrically interrupted by two tunnel contacts is referred to as a DC-SQUID. A SQUID installation offers a sensitivity in the measurement of magnetic fields which covers sixteen orders of magnitude of the magnetic field strength. The detection limit for the field boundary is about $10^{-15}$ Tesla, which permits the measurement of the smallest field differences and smallest field strengths. Accordingly, applications of such SQUID systems are extremely weak magnetic fields, such as occur in medicine, the location of old waste and in the search for deposits.

When an electromagnetic field acts on a superconductive ring, a supercurrent is generated in the ring. The field penetrates to a specified depth into the superconductor, and as from a specified field strength the superconduction is destroyed. If the ring is interrupted by a superconductive tunnel contact, by reason of the far smaller critical current of the tunnel contact the critical current is reached and the contact point becomes normally conductive i.e. the flow of current in the ring is interrupted. The supercurrent flowing through a tunnel element induces a voltage in the superconductive control layers which are situated between the superconductive tunnel layers, so that the control layers take over the function of the induction coil to couple out the signal voltage. If n tunnel elements are situated in a stack, then in n tunnel elements in the case of each current flow the tunnel current will in each instance induce a voltage in the integrated control layers. As a result of series connection of the control layers in the stack, the induced voltage is totalled on the basis of the number of tunnel elements. Advantageously, the number of tunnel elements in a tunnel stack is chosen to be so high that the conventional preamplifiers become superfluous. Furthermore, it is possible to switch one or more tunnel elements in a tunnel stack for the parametric amplification of the signal while still in the ring.

Figure 14:
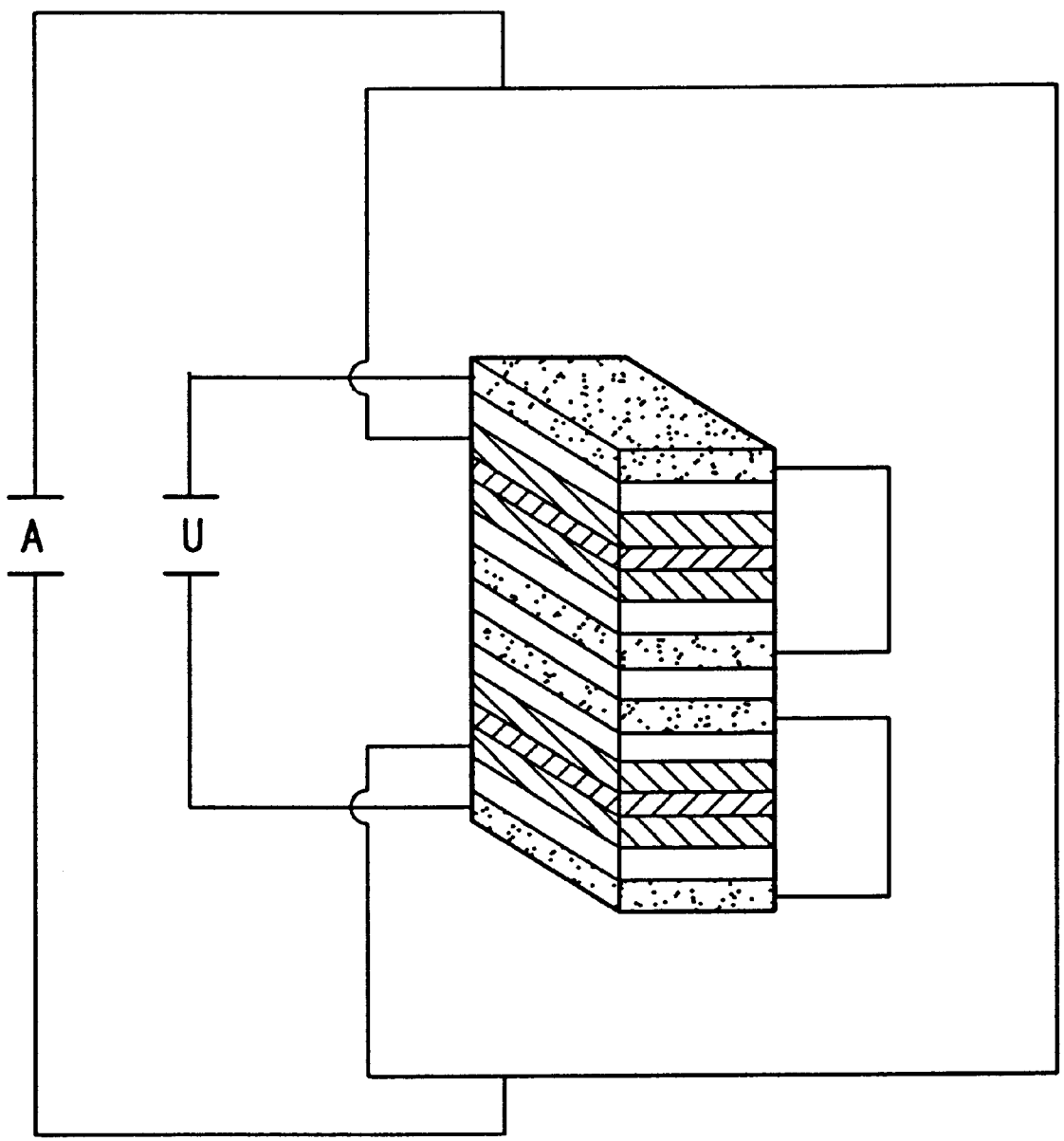
FIG. 14 shows a tunnel-stack-based RF-SQUID in diagrammatic representation.
Figure 15:
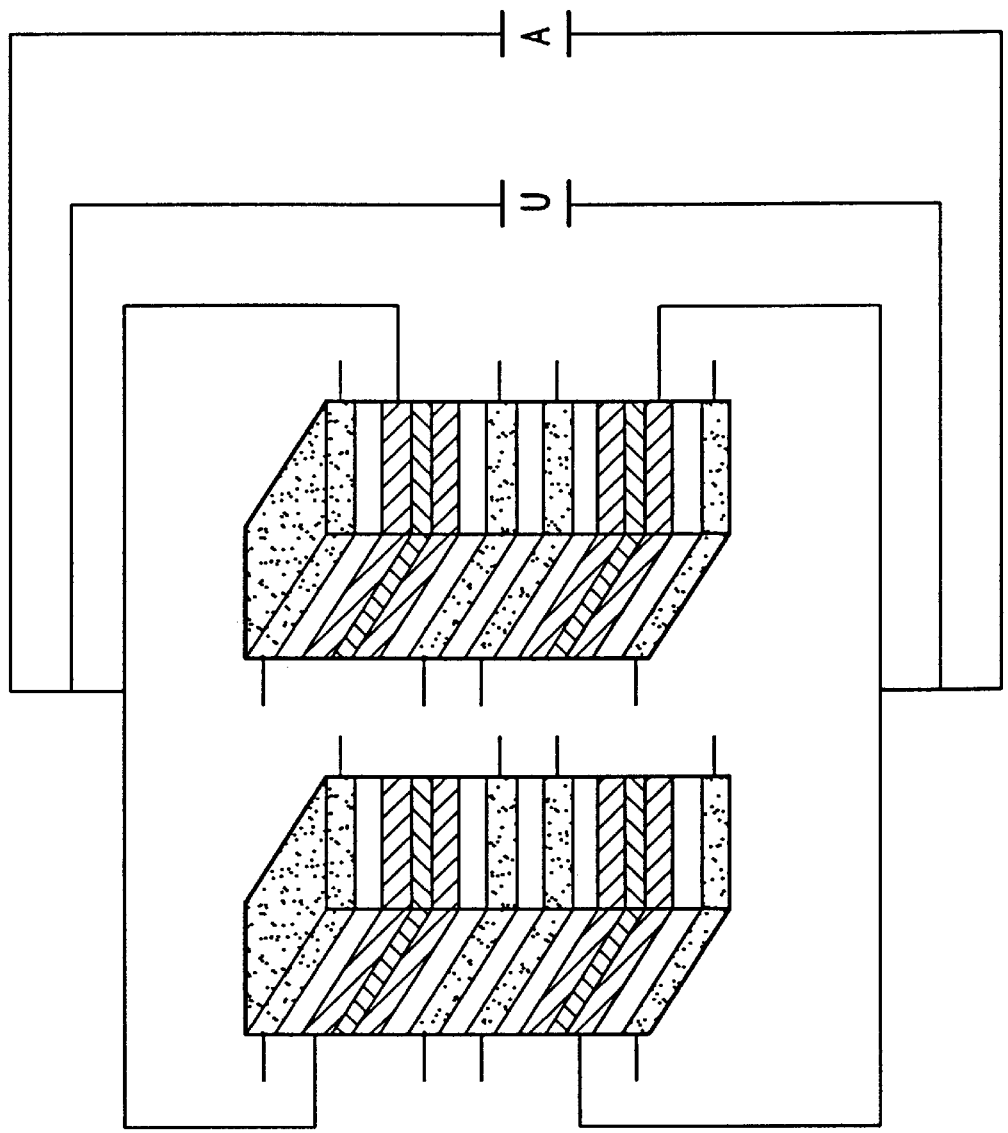
FIG. 15 shows a tunnel-stack-based DC-SQUID in diagrammatic representation.

FIG. 14 shows a diagram of an RF-SQUID based on a tunnel stack (with two tunnel elements according to FIG. 1; alternatively, it is also possible to use tunnel elements according to FIG. 2 or according to FIG. 3, the latter with or without proximity layers P1, P2); in this case, the signal voltage U is picked off inductively via the superconductive, serially connected control layers. FIG. 15 shows a diagram of a DC-SQUID based on a tunnel stack (with in each case two tunnel elements according to FIG. 1; alternatively, it is also possible to use tunnel elements according to FIG. 2 or according to FIG. 3, the latter with or without proximity layers P1, P2) in which the signal voltage U is picked off serially via the tunnel voltage.

The RF-SQUID system shown in FIG. 14 consists of a superconductive ring which is interrupted by a tunnel stack. The signal voltage is summated, via the superconductive control layers present in the tunnel stack, in a series circuit and then fed to the signal processing. The advantages in the use of the tunnel stack in the RF-SQUID reside in the summating of the signal voltage. A signal voltage which is higher by three to four orders of magnitude does not require any costly electronic amplifier system. Thus, the substantially more compact RF-SQUID system can be adapted in controlled fashion for a multiplicity of functions.

The DC-SQUID system, shown in FIG. 15, having two symmetrically disposed Josephson tunnel elements summates the tunnel voltage in a series circuit of all tunnel elements in the stack. By applying defined voltages to the control layers of both stacks, the two tunnel systems can be adjusted. The tunnel stacks alone deliver signal voltages which are greater by three to four orders of magnitude, as a result of which it is possible to dispense with a costly electronic amplifier system. One tunnel stack in the RF-SQUID or, respectively, two tunnel stacks in the DC-SQUID are provided on a substrate parallelepiped with mounting. The free ring part is situated in the signal direction. The entire SQUID system is disposed in a cryostat.

The sensitivity of such superconductive electronic tunnel circuits is so great that distances from the targets in a region of space can be greater by orders of magnitude, for measurements to be made. By way of example, let a section of terrain be predetermined, having a specified length and width. It is presumed that objects to be sought (old waste) are located at differing depths in the ground. For the purpose of detection, this section is divided into a specified number of strip sections, which are traversed or overflown by a ground vehicle or by an aircraft. The strip width is dependent upon the field of view and the resolution of the sensor system, which preferably corresponds at least to the vehicle width. To formulate an image-generating process which is capable of identification, the field sensor must scan the region of space to be investigated. That field of view of the ground surface which is to be represented in each instance could be divided into a network having a specified number of lines. A defined number of measurement points would then be provided on a line. The density of the grid, i.e. the density of the line measurement points and the width spacings between the lines, would be optimized as a function of the measurement sensitivity, the size of the area to be searched and the distances involved. If a single sensor is used, it must be passed to each measurement point of the region to be investigated. This can take place in the following ways:

1. The region is traversed linewise with the individual sensor; in this case, the sensor moves only horizontally. The process gives a raster field containing the data concerning the field magnitudes of target objects. In addition, appertaining to the measured variables which belong to the same target object, direction and distance from the target object can be determined using trigonometric processes.
2. The single sensor is extended by two further sensors, each sensor being aligned with its alignment in the direction of the three axes of the Cartesian coordinate system. The measured voltages in the three SQUID sensors are then functions of the angles and contain the information concerning the direction of the signal. This procedure is followed in the case of each measurement point. It is also possible to replace a single sensor by its sensor surface, on which SQUID sensors are disposed linewise. In this case, the dimension of the sensor surface should be of such magnitude that automatic triangulation calculations are possible with the required accuracy, for which purpose dimensions of a few centimeters to about 1 meter may be necessary. The occupation density of the SQUID field determines the resolution of the objects.

The linewise scanning of the region can now take place by scanning the line structure of the SQUID field. In this case also, the sensor surfaces could be expanded to three, which would then again be aligned in the direction of the three axes of a Cartesian coordinate system.

In the case of large regions of space, it may also be expedient to dispose the SQUID fields on a spherical surface, e.g. a quarter sphere. The scanning of the space could then proceed from spatial polar coordinates; the SQUID fields on the partial spherical surfaces are to be distributed uniformly in their spacings, their occupation density again being implemented in a manner corresponding to the desired resolution. The measurement data can then be read linewise, as in the case of a plane SQUID field system. The SQUID-based sensor system, which must be incorporated into an adapted cooling system, can be mounted in a transportable equipment assembly. The equipment assembly has its own vibration isolation as well as an independent power supply with battery buffering, which is protected as appropriate against disturbances. Instead of being disposed on a sphere, the SQUID systems can also be disposed on a tube section, e.g. for use in medicine for the imaging of patients.

The preconditions for an image-controlled process for the location, surveying and investigation of objects on the basis of the measurement of magnetic fields are satisfied by specifying the coordinates of the measurement points in space and the associated physical measured values. The direction of the fields and the distance of the origin of the fields which emanate from the target objects are measured with a degree of accuracy unlike any other process of the art. The measurement signals of the target objects can then be used directly for signal analysis and for the image-generating process. A distance determination and a general survey of the target objects are also linked to the image-generating process. By introducing a coordinate system, the structures can then be imaged to true scale with their orientation in space and facilitate an identification of the target objects. The signals which are present in digital form are processed and evaluated by a superconductive digital technology.

In the case of medical magnetic field measurements, for example on the heart, it is possible to analyze the fine structure within the pulse intervals, the pulse width, the pulse repetition interval and amplitude fluctuations.

Physicians could, for example, also see very small scars on the heart or other organs. Bridge builders could trace very fine cracks in their structures.

The structure of an RF-SQUID field system differs from a superconductive camera essentially in that the tunnel stacks are provided with rings.

In order to be able to determine angle and distance for each measurement point, two in each case vertically arranged RF-SQUID systems are connected together to form a SQUID field. One RF-SQUID is in each instance sufficient for the angle determination. The greater the spacings from the two reference RF-SQUID systems, the more accurately are the angles measured at the individual measurement points, and the more accurate are the distances from the objects.

Figure 16:
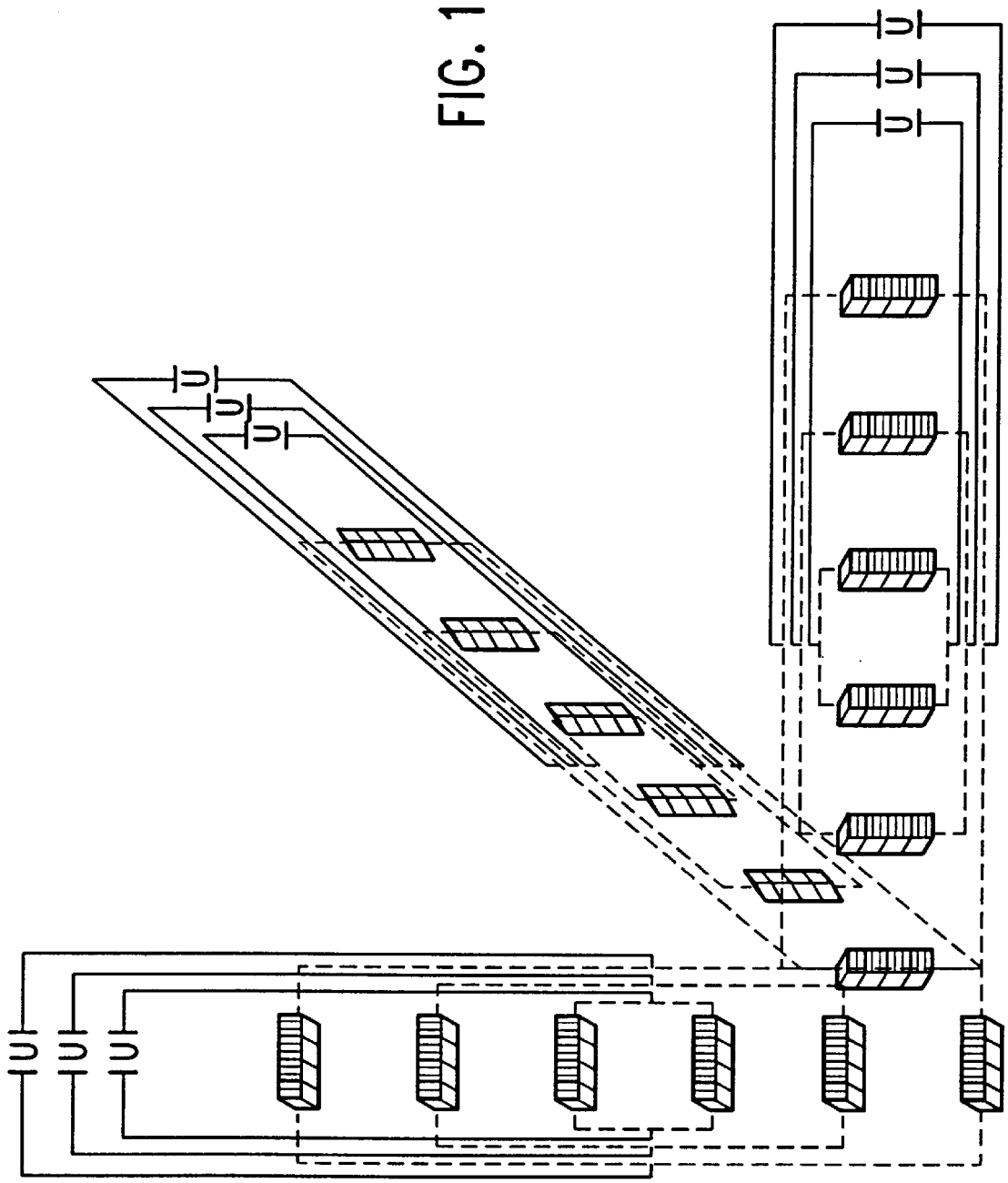
FIG. 16 shows a DC-SQUID axis field in diagrammatic representation.

The structure of a DC-SQUID axis field is diagrammatically represented in FIG. 16. A DC-SQUID field system measures the field gradient of a steady field and enables, inter alia, a convenient determination of the field direction.

A plurality of intermeshing DC-SQUID elements form a DC-SQUID axis. In each case one DC-SQUID axis is provided for the three axes length, width and height. The inner DC-SQUID pair within an axis has the smallest and the outer DC-SQUID pair has the largest measurement distance. The potential difference of the electromagnetic field strength is measured. Measurement making use of three axes makes it possible to identify individual sources and to determine their distance.

A superconductive electronic apparatus of a DC-SQUID field system consists of the following assemblies: a cryostat, in which the dome must be suitable for entire cubes, three DC-SQUID axes on a substrate parallelepiped, an electronic control system to operate the tunnel stack SQUID circuits, superconductive screens against disturbing fields and a mounting including supply lines with control and signal lines.

Figure 17:
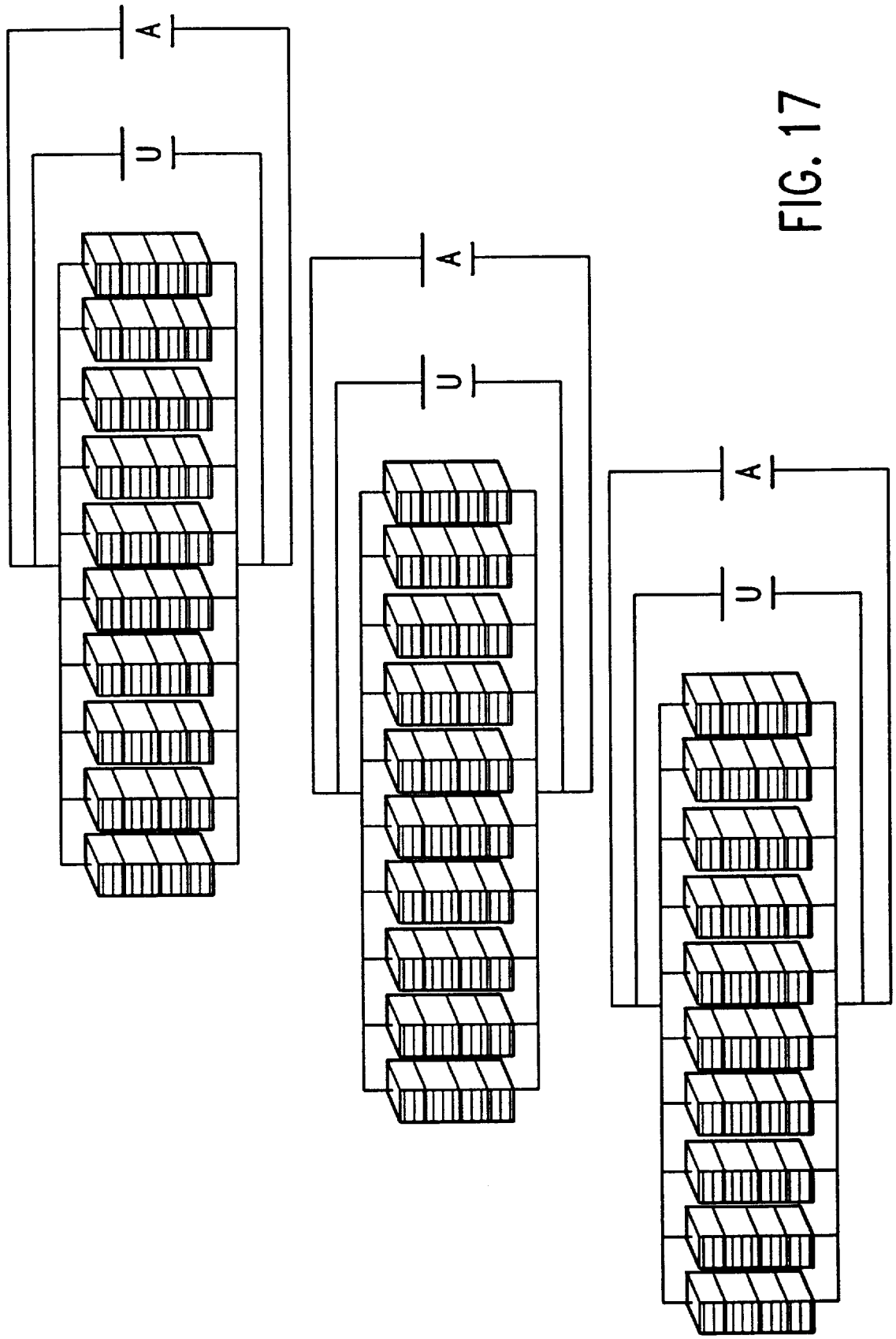
FIG. 17 shows a circuit diagram of a quantum interference system.

The structure of a quantum interference system is shown in FIG. 17 in the form of a circuit diagram. The quantum interference system consists of n tunnel stacks connected in parallel as a line. In this case, n is any integer and may amount to more than one thousand stacks per mm. In these circumstances, a line having a length of 10 cm may contain about one million tunnel stacks. These lines can be disposed in thousands at micron spacings in the manner of an optical grating, and then form the quantum interference system. This interference system permits the most precise magnetic field measurements known to physics.

A superconductive electronic apparatus of a quantum interference system consists of the following assemblies: a cryostat, in which the dome must be suitable for entire cubes, one or more substrate parallelepipeds with a linewise arrangement of n tunnel stacks connected in parallel as shown in FIG. 17, an electronic control system to operate the tunnel stack interference circuits, superconductive screens against disturbing fields and mountings including supply lines with control and signal lines.

What is claimed is:

1. A superconductive tunnel element comprising superconductors, at least one barrier and insulators, which has the following layer structure: superconductor (S1), insulator (I), superconductor (S2), proximity layer (P1), barrier (B), proximity layer (P2), superconductor (S3), insulator (I), and superconductor (S4);

wherein the proximity layers (P1, P2) are formed of a normal conductor, semiconductor or superconductor with an energy gap which is smaller than the energy gap of superconductors (S2, S3) adjacent to the respective proximity layers (P1, P2).

2. The tunnel element as claimed in claim 1, which has, on both sides and symmetrically in relation to the barrier (B) on the in each instance outwardly disposed superconductors (S1, S4), an additional insulator (I) and an additional superconductor (S0, S5).

3. The tunnel element as claimed in claim 1, which has on one side, adjoining the last superconductor (S4), the following additional layers: insulator (I), superconductor (S5), insulator (I), superconductor (S6), barrier (B), and superconductor (S7).

4. The tunnel element as claimed in claim 1, wherein each superconductor has individual superconductive connections.

5. The tunnel element as claimed in claim 1, wherein the in each instance outer superconductor on both sides of the barrier (B) serves as a control layer.

6. The tunnel element as claimed in claim 2, wherein the in each instance central superconductor (S1, S4) of the in each instance three superconductors (S0, S1, S2 or S3, S4, S5) disposed on both sides of the barrier (B) serves and is connected as a control layer, and the in each instance outer superconductors (S0, S2; S3, S5) are connected to one another via a short circuit bridge and are insulated from the control layer, a working voltage being applied to inputs of the outwardly disposed superconductors (S1, S6) and a signal current at the outputs being picked off.

7. The tunnel element as claimed in claim 6, wherein the short circuit bridge is superconductive.

8. The tunnel element as claimed in claim 3, wherein, in a computer circuit, the superconductors (S2, S3) adjacent to the barrier (B) serve as superconductive tunnel layers, the outer superconductor (S1) serves as a write line, the superconductor (S4) adjacent to the additional layers serves as part of a tunnel loop, and the additional superconductors (S6, S7) adjacent to the additional barrier form together with the additional barrier a Josephson contact, which forms a circuit together with the further additional superconductor (S5) serving as a read line.

9. A tunnel stack which is formed by in each instance two or more tunnel elements according to claim 1, separated from one another in each instance by an insulator.

10. A tunnel stack which is formed by in each instance two or more tunnel elements according to claim 2, separated from one another in each instance by a tunnel barrier.

11. The tunnel stack as claimed in claim 9, wherein each tunnel element is individually controllable and/or switchable.

12. The tunnel stack as claimed in claim 9, wherein at least two tunnel elements are switchable and/or controllable in common.

13. A digital superconductive electronic camera, comprising:

at least one substrate parallelepiped having a tunnel stack field composed of tunnel stacks, each tunnel stack being formed of a superconductive tunnel element comprising superconductors, at least one barrier and insulators, which has the following layer sequence: superconductor (S1), insulator (I) superconductor (S2), proximity layer (P1), barrier layer (B), proximity layer (P2), superconductor (S3), insulator (I), and superconductor (S4), wherein the proximity layers (P1, P2) are formed of a normal conductor, semiconductor or superconductor with an energy gap which is smaller than the energy gap of superconductors (S2, S3) adjacent to the respective proximity layers (P1, P2); and an electronic control system operatively coupled with the tunnel stack to control the camera.

14. A superconductive electronic radiator, comprising:

a superconductive tunnel element comprising superconductors, at least one barrier and insulators, which has the following layer structure: superconductor (S1), insulator (I), superconductor (S2), proximity layer (P1), barrier (B), proximity layer (P2), superconductor (S3), insulator (I), and superconductor (S4); wherein the proximity layers (P1, P2) are formed of a normal conductor, semiconductor or superconductor with an energy gap which is smaller than the energy gap of superconductors (S2, S3) adjacent to the respective proximity layers (P1, P2);

micropeizo positioning systems;

a resonator system;

a mount having control and signal lines; and electronic control arrangements operatively coupled with the superconductive tunnel element and micropeizo positioning systems.

15. A superconductive electronic radiation pincer, comprising:

a plurality of substrate parallelepipeds in a spherical arrangement having a field of superconductor electronic coherent radiators, said radiators including a superconductive tunnel element comprising superconductors, at least one barrier and insulators, which has the following layer structure: superconductor (S1), insulator (I), superconductor (S2), proximity layer (P1), barrier (B), proximity layer (P2), superconductor (S3) , insulator (I), and superconductor (S4); wherein the proximity layers (P1, P2) are formed of a normal conductor, semiconductor or superconductor with an energy gap which is smaller than the energy gap of superconductors (S2, S3) adjacent to the respective proximity layers (P1, P2);

precision adjusting devices operatively coupled with the radiators;

electronic control systems operatively coupled to the tunnel elements and to peizo-stacks;

superconductive screens which operate against disturbing fields; and a mounting having control and signal lines for the radiation pincer.

16. A quantum interference system, comprising:

a cryostat, in which a dome is suitable for entire cubes;

at least one substrate parallelepiped having a linewise arrangement of tunnel stacks connected in parallel, each of said tunnel stacks including a superconductive tunnel element comprising superconductors, at least one barrier and insulators, which has the following layer structure: superconductor (S1), insulator (I), superconductor (S2), proximity layer (P1), barrier (B), proximity layer (P2), superconductor (S3), insulator (I), and superconductor (S4); wherein the proximity layers (P1, P2) are formed of a normal conductor, semiconductor or superconductor with an energy gap which is smaller than the energy gap of superconductors (S2, S3) adjacent to the respective proximity layers (P1, P2);

an electronic control system operatively coupled with the tunnel stack;

superconductive screens operating against disturbing fields; and a mounting having control and signal lines for operating the quantum interference system.

* * * * *